(12) United States Patent
Clark

(10) Patent No.: US 10,024,879 B2
(45) Date of Patent: Jul. 17, 2018

(54) PERFORMANCE IMPROVEMENT OF MEMS DEVICES

(71) Applicant: Purdue Research Foundation, West Lafayette, IN (US)

(72) Inventor: Jason Clark, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 133 days.

(21) Appl. No.: 14/784,513

(22) PCT Filed: Mar. 20, 2014

(86) PCT No.: PCT/US2014/031330
§ 371 (c)(1),
(2) Date: Oct. 14, 2015

(87) PCT Pub. No.: WO2014/200606
PCT Pub. Date: Dec. 18, 2014

(65) Prior Publication Data
US 2016/0097789 A1 Apr. 7, 2016

Related U.S. Application Data

(60) Provisional application No. 61/811,789, filed on Apr. 14, 2013, provisional application No. 61/811,827, filed on Apr. 15, 2013.

(51) Int. Cl.
*G01P 15/02* (2013.01)
*G01C 19/56* (2012.01)
(Continued)

(52) U.S. Cl.
CPC .......... *G01P 15/02* (2013.01); *G01C 19/5719* (2013.01); *G01C 19/5726* (2013.01);
(Continued)

(58) Field of Classification Search
CPC .... G01P 15/02; G01P 15/0802; G01P 15/125; G01C 19/5712; G01C 19/5747; G01C 19/5755; G01C 19/5719; G01C 19/5726
See application file for complete search history.

(56) References Cited

U.S. PATENT DOCUMENTS

| 5,103,667 | A | | 4/1992 | Allen | |
|---|---|---|---|---|---|
| 5,780,740 | A | * | 7/1998 | Lee | B06B 1/0292 331/156 |

(Continued)

OTHER PUBLICATIONS

Agarwal, et al., "Stochastic Analysis of Electrostatic MEMS Subjected to Parameter Variations," Journal of Microelectromechanical Systems, vol. 18, No. 6, Dec. 2009, pp. 1454-1468.

(Continued)

*Primary Examiner* — Helen Kwok
(74) *Attorney, Agent, or Firm* — Purdue Research Foudnation

(57) ABSTRACT

A microelectromechanical-systems (MEMS) device includes a driven mass and has a natural stiffness or damping. An actuator applies force to the mass, movement of which is measured by a sensing capacitor. A control circuit operates the actuator per displacement or velocity of the driven mass, so that a characteristic stiffness or damping of the mechanical subsystem is different from the respective natural value. A method of transforming a MEMS device design includes determining an aim performance value of the design and a baseline performance uncertainty of the design, selecting candidate sets of parameter values, determining a candidate, first, and second performance value for each, scoring the candidates, and repeating until one of the candidates satisfies a termination criterion, so the transformed design using that candidate set has the aim perfor- (Continued)

mance value and the respective first and second performance values closer to each other than the baseline performance uncertainty.

7 Claims, 16 Drawing Sheets

(51) Int. Cl.
    *G01C 19/5747* (2012.01)
    *G01C 19/5719* (2012.01)
    *G01C 19/5726* (2012.01)
    *G01P 15/125* (2006.01)
    *G01P 15/08* (2006.01)
    *G06F 17/50* (2006.01)

(52) U.S. Cl.
    CPC ...... *G01C 19/5747* (2013.01); *G01P 15/0802* (2013.01); *G01P 15/125* (2013.01); *G06F 17/50* (2013.01); *G01P 2015/0882* (2013.01)

(56) References Cited

U.S. PATENT DOCUMENTS

| | | | | |
|---|---|---|---|---|
| 5,780,948 | A * | 7/1998 | Lee | F16F 7/1011 310/20 |
| 5,914,553 | A * | 6/1999 | Adams | G01P 1/006 310/309 |
| 6,497,141 | B1 * | 12/2002 | Turner | H03H 9/2405 310/309 |
| 6,497,149 | B1 * | 12/2002 | Moreau | G01P 15/125 73/514.32 |
| 6,617,750 | B2 * | 9/2003 | Dummermuth | B81B 3/0072 310/309 |
| 8,076,893 | B2 * | 12/2011 | Dong | H02N 1/006 310/309 |
| 9,739,613 | B2 * | 8/2017 | Coronato | G01C 19/5747 |
| 2007/0080695 | A1 | 4/2007 | Morrell | |
| 2008/0202237 | A1 * | 8/2008 | Hammerschmidt | G01C 19/5719 73/504.04 |
| 2008/0210005 | A1 * | 9/2008 | Rougeot | G01C 19/5747 73/504.12 |
| 2010/0192266 | A1 | 7/2010 | Clark | |
| 2010/0281977 | A1 * | 11/2010 | Coronato | G01C 19/5712 73/504.14 |
| 2011/0252887 | A1 * | 10/2011 | Cardarelli | F16F 15/03 73/514.32 |
| 2012/0125101 | A1 * | 5/2012 | Seeger | G01C 19/5755 73/504.14 |
| 2014/0326070 | A1 * | 11/2014 | Neul | G01C 19/574 73/504.12 |
| 2015/0177272 | A1 * | 6/2015 | Clark | G01P 15/097 850/5 |

OTHER PUBLICATIONS

Alwan, et al., "Uncertainty Quantification of MEMS Using a Data-Dependent Adaptive Stochastic Collocation Method," Computer Methods in Applied Mechanics and Engineering, vol. 200, 2011, pp. 3169-3182.
Audet, et al., "Analysis of Generalized Pattern Searches," Society for Industrial and Applied Mathematics: Journal of Optimization, vol. 13, No. 3, Aug. 2002, pp. 889-903.
Bailer, et al., "A Cantilever Array-Based Artificial Nose," Ultramicroscopy, vol. 82, 2000, pp. 1-9.
Baser, et al., "Surface Micromachined Accelerometers," IEEE Journal of Solid-State Circuits, vol. 31, No. 3, Mar. 1996, pp. 366-375.
Clark, et al., "Modeling, Simulation, and Verification of an Advanced Micromirror Using SUGAR," Journal of Microelectromechanical Systems, vol. 16, No. 6, Dec. 2007, pp. 1524-1536.
Dong, et al., "A High-Performance Accelerometer with a Fifth-Order Sigma-Delta Modulator," Journal of Micromechanics and Microengineering, vol. 15, Jun. 2005, pp. 22-29.
Erbe, et al., "Mechanical Mixing in Nonlinear Nanomechanical Resonators," Applied Physics Letters, vol. 77, No. 19, Nov. 2000, pp. 3102-3104.
George, et al., "Free-Form Simulation of Sequential Etching and Surface Characterization for 3-D MEMS Fabrication," Journal of Microelectromechanical Systems, vol. 18, No. 2, Apr. 2009, pp. 296-307.
Gittes, et al., "Thermal Noise Limitations on Micromechanical Experiments," Biophysics Letter, vol. 27, 1998, pp. 75-81.
Han, et al., "Robust Optimal Design of a Vibratory Microgyroscope Considering Fabrication Errors," Journal of Micromechanics and Microengineering, vol. 11, Oct. 2001, pp. 662-671.
Handtmann, et al., "Sensitivity Enhancement of MEMS Inertial Sensors Using Negative Springs and Active Control," Sensors and Actuators A: Physical, vols. 97-98, Apr. 2002, pp. 153-160.
Jiang, et al., "A Monolithic Surface Micromachined Z-Axis Gyroscope with Digital Output," 2000 Symposium on VLSI Circuits Digest of Technical Papers, pp. 16-19.
Jochaim, et al., "Characterization of Selective Polysilicon Deposition for MEMS Resonator Tuning," Journal of Microelectromechanical Systems, vol. 12, No. 2, Apr. 2003, pp. 193-200.
Lee, et al., "A Frequency-Tunable Comb Resonator Using Spring Tension and Compression Effects," retrieved on Dec. 15, 2013 at <<http://asmedigitalcollection.asme.org/>> 2004 ASME Intl Mechanical Engineering Congress and Expositon, 2004.
Lee, et al., "A Frequency-Tunable Microactuator with a Varied Comb-Width Profile," Berkeley Sensor and Actuator pp. 257-260.
Leland, Robert P., "Mechanical-Thermal Noise in MEMS Gyroscopes," IEEE Sensors Journal, vol. 5, No. 3, Jun. 2005, pp. 493-500.
Liang, et al., "Thermal Noise Reduction of Mechanical Oscillators by Actively Controlled External Dissipative Forces," Ultrarnicroscopy, vol. 84, 2000, pp. 119-124.
Liu, et al., "Multi-Objective Design Optimization of Electrostatically Actuated Microbeam Resonators With and Without Parameter Uncertainty," Reliability Engineering and System Safety, vol. 92, 2007, pp. 1333-1343.
Lubbe, et al., "Precise Determination of Force Microscopy Cantilever Stiffness from Dimensions and Eigenfrequencies," Measurement Science and Technology, vol. 23, 2012, pp. 1-9.
Marepalli, et al., "SugarCube: An Online CAD Tool for Parametrically Investigating the Performance of Ready-Made MEMS," Birck Nanotechnology Center, Purdue University.
Mehta, et al., "Manipulation and Controlled Amplification of Brownian Motion of Microcantilever Sensors," Applied Physics Letters, vol. 78, No. 11, Mar. 2001, pp. 1637-1639.
Prakash, et al., "Parametric Noise Squeezing and Parametric Resonance of Microcantilers in Air and Liquid Environments," Review of Scientific Instruments, vol. 83, 2012, pp. 1-12.
Reh, et al., "Quality Based Design and Design for Reliability of Micro Electro Mechanical Systems (MEMS) Using Probabilistic Methods," ANSYS, Inc., 4 pages.
Ren, et al., "Statistical Optimal Design of Microelectromechanical System (MEMS)," Duke University, Department of Electrical Engineering, 4 pages.
Schenato, et al., "Process Variation Analysis for MEMS Design," University of California at Berkeley, Dept. of Electrical Engineering and Computer Sciences, Aug. 2000, pp. 1-12.
Shavezipur, et al., "Fabrication Uncertainties and Yield Optimization in MEMS Tunable Capacitors," Sensors and Actuators A: Physical, vol. 147, 2008, pp. 613-622.
Tran, et al., "Zeptofarad (10-21F) Resolution Capacitance Sensor for Scanning Capacitance Microscopy," Review of Scientific Instruments, vol. 72, No. 6, Jun. 2001, pp. 2618-2623.
Vudathu, et al., "Yield Analysis via Induction of Process Statistics into the Design of MEMS and Other Microsystems," Microsystem Technology, vol. 13, 2007, pp. 1545-1551.

(56) References Cited

OTHER PUBLICATIONS

Zhang, et al., "Effect of Cubic Nonlinearity on Auto-Parametrically Amplified Resonant MEMS Mass Sensor," Sensors and Actuators A: Physical, vol. 102, 2002, pp. 139-150.
PCT Search Report & Written Opinion for Application No. PCT/US2014/031330, dated Dec. 1, 2014, 12 pages.

* cited by examiner

PERFORMANCE IMPROVEMENT OF MEMS DEVICES

CROSS-REFERENCE TO RELATED APPLICATIONS

This application is the National Stage of International Application No. PCT/US2014/031330, filed Mar. 20, 2014 and entitled "Performance Improvement of MEMS Devices," which claims the benefit of U.S. Provisional Patent Application Ser. No. 61/811,789, filed Apr. 14, 2013 and entitled "Minimizing the Variation in Performance by Optimizing the Design Parameters of Micro Electro Mechanical Systems," and Ser. No. 61/811,827, filed Apr. 15, 2013, and entitled "Active Control of Effective Mass, Damping and Stiffness of MEMS," the entirety of each of which is incorporated herein by reference.

STATEMENT OF FEDERALLY SPONSORED RESEARCH OR DEVELOPMENT

This invention was made with Government support under Contract No. CNS-0941497 awarded by the National Science Foundation. The government has certain rights in the invention.

TECHNICAL FIELD

The present application relates to microelectromechanical systems (MEMS) and nanoelectromechanical systems (NEMS), and particularly to improving the performance of such systems.

BACKGROUND

Microelectromechanical systems (MEMS) are commonly fabricated on silicon (Si) or silicon-on-insulator (SOI) wafers, much as standard integrated circuits are. However, MEMS devices include moving parts on the wafers as well as electrical components. Examples of MEMS devices include gyroscopes, accelerometers, and microphones. MEMS devices can also include actuators that move to apply force on an object. Examples include microrobotic manipulators.

However, when a MEMS device is fabricated, the dimensions of the structures fabricated often do not match the dimensions specified in the layout. This can result from, e.g., under- or over-etching. Such mismatches can change the performance of the devices away from the intended performance. Due to variations from causes such as fabrication processing, packaging, actuation signals, and external disturbances, the true performance can be greater than 100% different than performance predicted based on the original design. It is desirable to reduce this variation to increase yield of MEMS devices.

Some attempts have been made to electronically tune microstructures by various forms of feedback control. These include position controlled feedback to control the effective stiffness of a micro-cantilever to improve the quality factor Q for biological sensing applications; electrostatic force-feedback to improve linearity, bandwidth, and dynamic range; digital force-feedback to a MEMS gyroscope in order to lower the noise floor down to the thermal noise limit; and frequency tuning of micro-resonators using a combination of Joule heating and electrostatic force. Micro-resonators with tapered comb fingers for electrostatic, post-fabrication frequency tuning have also been described. Electrostatic capacitor sensor and actuator pairs have been used to sense a displacement, and force feedback pulses for have been used for position re-zeroing. Velocity feedback control has been described to control damping. Time varying stiffness has been described for parametric amplification. There is a continuing need for ways of reducing variation or improving performance by feedback control.

Moreover, various attempts have been made to adjust or analyze the design of MEMS structures. Examples include those using a statistical framework for quantifying uncertainties through probability densities. However, quantifying uncertainties does not necessarily permit reducing those uncertainties. Monte Carlo (MC) algorithms have been used, for example, to consider the uncertainties associated with MEMS modeling parameters. One prior scheme used a robust optimization approach based on MC to estimate the worst case during the design of a micro gyroscope. A genetic algorithm based on MC simulation has been used for optimizing the filter performance of a MEMS resonator in terms of the shape of the frequency response curve. Probabilistic design systems such as in the ANSYS software have been used to study the effect of various geometrical features on the design of a comb drive. However, MC algorithms can have high or impractical computational costs. Stochastic approaches have also been used to model uncertainties in the input parameters of micromechanical devices and to quantify their effect on the final performance of the device. However, quantifying is not reducing, as noted above. There is, therefore, a continuing need of ways of improving the performance of MEMS devices, whether by dynamic tuning or by design adjustment.

Reference is made to the following:

S. D. Senturia, "Mechanical Properties of Microsensor Materials: How to Deal with the Process Dependences?," *Proc. Mater. Res. Soc. Symp. Dig.*, vol. 239, pp. 3-11, 1992.

A. Mehta, S. Cherian, D. Hedden, and T. Thundat, "Manipulation and controlled amplification of Brownian motion of microcantilever sensors," *Applied Physics Letters*, vol. 78, pp. 1637-1639, 2001.

K. B. Lee, A. P. Pisano, and L. Lin, "A frequency-tunable comb resonator using spring tension and compression effects," *Proceedings of IMECE04*, Anaheim, Calif. USA, Nov. 13-20, 2004.

K. B. Lee, L. Lin, and Y.-H. Cho, "A frequency-tunable microactuator with a varied comb-width profile," Micro Electro Mechanical Systems, 2004. 17th IEEE International Conference on. (MEMS), pp. 257-260, 2004.

M. Handtmann, R. Aigner, A. Meckes, and G. K. M. Wachutka, "Sensitivity enhancement of MEMS inertial sensors using negative springs and active control," *Sensors and Actuators A: Physical*, vol. 97â€"98, pp. 153-160, 2002.

S. Liang, D. Medich, D. M. Czajkowsky, S. Sheng, J.-Y. Yuan, and Z. Shao, "Thermal Noise Reduction of Mechanical Oscillators by Actively Controlled External Dissipative Forces," *Ultramicroscopy*, vol. 84, pp. 119-125, 1999.

H. Ren, A. Jog, and R. B. Fair, "Statistical Optimal Design of Microelectromechanical System", International MEMS Conference 2006.

M. Shavezipur, K. Ponnambalam, A. Khajepour, et al. "Fabrication uncertainties and yield optimization in MEMS tunable capacitors," Journal of Sensors and Actuators A: Physical, vol. 147, 2008, 613-622

S. P. Vudathu, K. K. Duganapalli, R. L. Dorota Kubalinska, et al. "Yield analysis via induction of process statics into the design of MEMS and other microsystems," Microsystem technology, vol. 13, pp. 1545-1551, 2007.

L. Schenato, W. Wu, L. El Ghaoui, et al. "Process Variation Analysis for MEMS Design," Proceedings of SPIE Symposium on Smart Materials and MEMS, 2000

J. S. Han and B. M. Kwak, "Robust optimal design of a vibratory microgyroscope considering fabrication errors," J. Micromech. Microeng., vol. 11, no. 6, pp. 662-671, October 2001.

A. Alwan, N. R. Alum. "Uncertainty quantification of MEMS using a data-dependent adaptive stochastic collocation method," Comput. Methods Appl. Mech Eng. pp. 3169-3182, 2011

N. Agarwal, N. R. Alum, "Stochastic analysis of electrostatic MEMS subjected to parameter variations," J. Microelectromechanical Systems, vol. 18, No. 6, pp. 1454-1468, 2009.

The discussion above is merely provided for general background information and is not intended to be used as an aid in determining the scope of the claimed subject matter.

BRIEF DESCRIPTION

According to an aspect of the invention, there is provided a microelectromechanical-systems (MEMS) device, comprising:

a) a mechanical subsystem including a driven mass, the subsystem having a natural stiffness or a natural damping, wherein the mass is at least partly movable or at least partly deformable;

b) an actuator responsive to a time-varying control signal to apply force to the driven mass;

c) a sensing capacitor including a first plate attached to and movable with the driven mass and a second plate substantially fixed in position, wherein a capacitance of the sensing capacitor varies as the driven mass moves;

d) a measurement circuit responsive to the capacitance of the sensing capacitor to provide first and second signals corresponding respectively to a displacement and to a velocity of the driven mass; and e) a control circuit configured to provide the time-varying control signal to the actuator in response to the first signal or the second signal and in response to a selected parameter, so that a characteristic stiffness or a characteristic damping of the mechanical subsystem is different from the natural stiffness or the natural damping, respectively, while the time-varying control signal is applied to the actuator.

According to another aspect of the invention, there is provided a method of transforming a microelectromechanical-systems (MEMS) device design with respect to a set of one or more parameters having selected initial values, the method comprising automatically performing the following steps using a processor:

using selected uncertainty values of the parameters, automatically determining first and second parameter offset sets of the design;

using the selected initial values of the parameters and the first and second parameter offset sets, determining an aim performance value of the design and a baseline performance uncertainty of the design;

a setup step of selecting a plurality of candidate sets of parameter values using the initial values;

determining a respective candidate performance value of the design for each of the candidate sets;

applying the first and second parameter offset sets to each of the candidate sets and determining respective first and second performance values of the design;

a scoring step of determining a respective score of each of the candidate sets using the aim performance value, the respective candidate performance value, and the respective first and second performance values;

a testing step of, if none of the respective scores satisfies a selected termination criterion, repeating the setup through testing steps using a selected one of the candidate sets in place of the initial values, so that one of the candidate sets is selected as a transformation of the design, and the transformed design has the respective candidate performance value corresponding to the aim performance value and the respective first and second performance values closer to each other than the baseline performance uncertainty.

Various aspects advantageously apply comb drive or other actuator forces to a driven mass to provide an effective stiffness, damping, or mass different from the physical stiffness, damping, or mass of the system.

Various aspects advantageously determine a set of parameters that reduces the variation in performance. That is, the resulting design has reduced sensitivity to process variations in geometry and material properties, and meets the desired performance specifications. Various aspects do not require or use distribution detail, and thus are computationally efficient.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

The attached drawings are for purposes of illustration and are not necessarily to scale.

DETAILED DESCRIPTION

Throughout this description, some aspects are described in terms that would ordinarily be implemented as software programs. Those skilled in the art will readily recognize that the equivalent of such software can also be constructed in hardware, firmware, or micro-code. Because data-manipulation algorithms and systems are well known, the present description is directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 1:
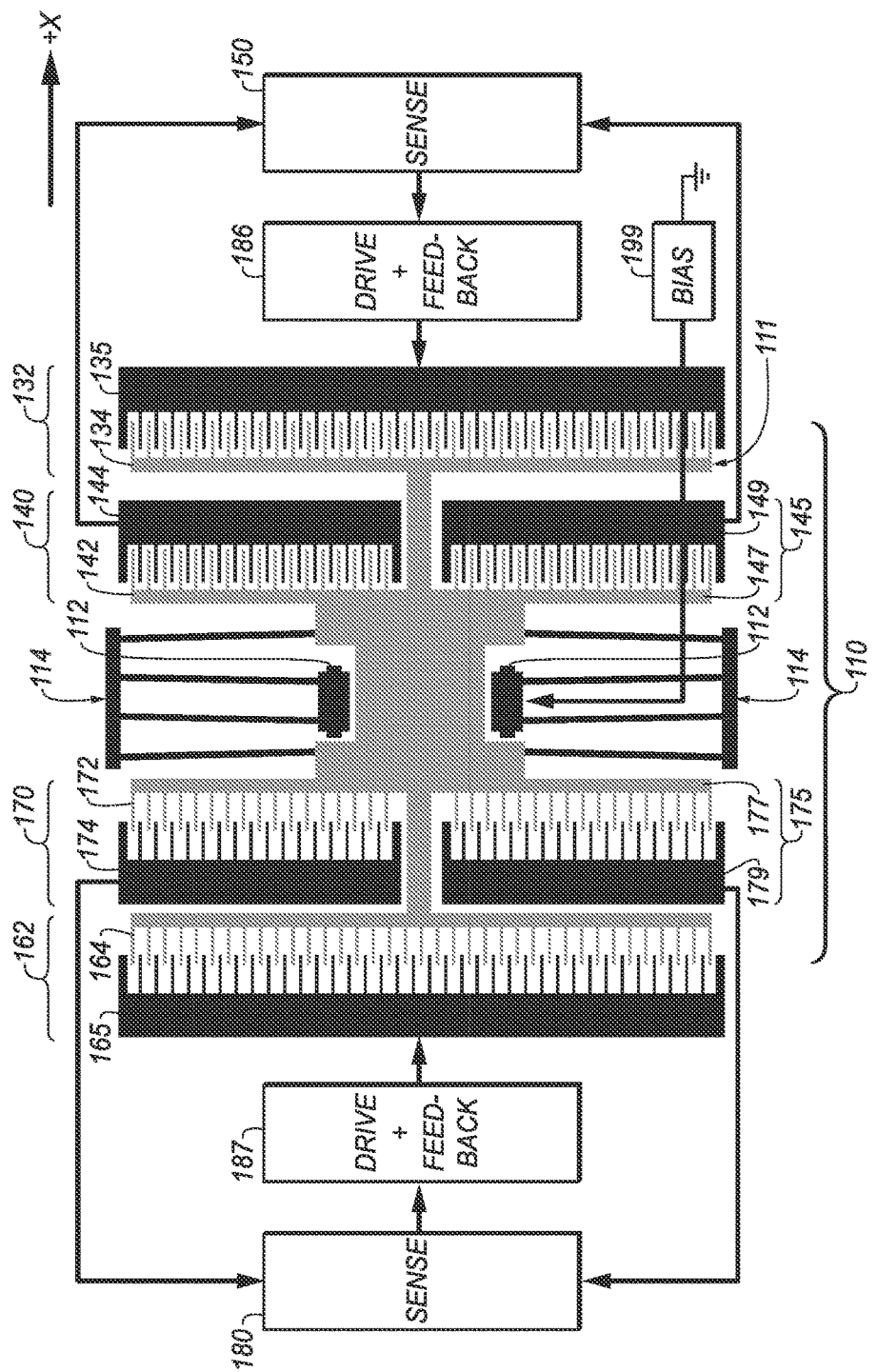
FIG. 1 is a schematic of an exemplary microelectromechanical-systems (MEMS) device and related components.

FIG. 1 is a schematic of an exemplary microelectromechanical-systems (MEMS) device and related components, e.g., a micro-electro-mechanical feedback system. In this system, feedback is used to make the device behave as if it had different mechanical properties. E.g., a feedback force proportional to displacement can be applied, which causes a change in effective stiffness k (since the force on a spring at displacement x is F=kxx). A feedback force proportional to velocity can be applied, which causes a change in effective damping d (since the force on a dashpot is F=dxx'). A feedback force proportional to acceleration can be applied, which causes a change in effective mass m (since the force on a mass is F=mxx"). The feedback force can be applied to simulated a positive or negative mass, damping, or stiffness.

Mechanical subsystem 110 includes a driven mass 111. The subsystem has a natural stiffness or a natural damping. Mass 111 is at least partly movable or at least partly deformable. Examples of mass 111 include cantilevers and the rotors of comb drives. For masses 111 that deform but do not move, subsystem 110 can have a natural stiffness. Such masses 111 are still driven by some actuator or by features included in mass 111.

Actuator 132 is responsive to a time-varying control signal to apply force to the driven mass 111. The force can be applied, e.g., in a direction along a displacement axis X.

In the example shown, mass 111 is supported by anchors 112 via flexures 114 so that it can oscillate along a displacement axis, in this example the indicated X axis. In FIG. 1, mass 111 is shown biased to the right (+X direction). A sensing capacitor 140 includes a first plate 142 attached to and movable with the driven mass 111 and a second plate 144 substantially fixed in position. "Attached to" includes plates that are formed as an integral part of driven mass 111, and likewise throughout. A capacitance of the sensing capacitor 140 varies as the driven mass 111 moves. Actuator 132 and sensing capacitor 140 are configured as comb drives; "plates" of capacitors can have this or any other shape. As used herein, a plate can form all or only part of one half of a two-electrode capacitor. Capacitance varies inversely with the distance between plates, however the plates are shaped.

A measurement circuit 150 ("SENSE") is responsive to the capacitance of the sensing capacitor 140 to provide first and second signals corresponding respectively to a displacement and to a velocity of the driven mass 111. In various aspects, measurement circuit 150 outputs three voltages. One voltage is proportional to displacement x at time t, another is proportional to velocity dx/dt at time t, and a last is proportional to $d^2x/dt^2$ at time t." The measurement circuit can be responsive to absolute capacitance or to change in capacitance.

A control circuit 186 is configured to provide the time-varying control signal to the actuator 132 in response to the first signal or the second signal from the measurement circuit 150 and in response to a selected parameter. A characteristic stiffness or a characteristic damping (or both) of the mechanical subsystem is different from the natural stiffness or the natural damping, respectively, while the time-varying control signal is applied to the actuator 132. Measurement circuit 150 and control circuit 186 can use any combination of analog or digital electronics. In some aspects, when the time delay through the feedback path is on the order of nanoseconds, the controller can be used for mechanical systems with natural resonant frequencies lower than 1 MHz.

In various aspects, measurement circuit 150 is further configured to provide a third signal corresponding to an acceleration of the mass 111. The mechanical subsystem 110 has a natural mass. The control circuit 186 is further configured to provide the time-varying control signal to the actuator 132 in response to the third signal, so that a characteristic mass of the mechanical subsystem 110 is different from the natural mass while the time-varying control signal is applied to the actuator 132.

In various aspects, the actuator 132 is configured to apply the force to the driven mass 111 in a direction along a displacement axis, e.g., +X as opposed to −X. The device further includes a second actuator 162 responsive to a second time-varying control signal to apply force to the driven mass 111 in a second, different direction along the displacement axis (e.g., −X). A second sensing capacitor 170 includes a first plate 172 attached to and movable with the driven mass 111 and a second plate 174 substantially fixed in position. A second capacitance of the second sensing capacitor 170 varies as the driven mass 111 moves, e.g., along the displacement axis, or deforms. A second measurement circuit 180 is responsive to the second capacitance to provide fourth and fifth signals corresponding respectively to the displacement and to the velocity of the driven mass 111. A second control circuit 187 is configured to provide the second time-varying control signal to the second actuator 170 in response to the fourth signal or the fifth signal and in response to a second selected parameter (the same as or different from the first parameter), so that a characteristic stiffness or a characteristic damping (or both) of the mechanical subsystem 110 is different from the natural stiffness or the natural damping, respectively, while the time-varying control signal is applied to the second actuator 162.

In various aspects, the second measurement circuit 180 is further configured to provide a sixth signal corresponding to the acceleration of the driven mass 111, and the mechanical subsystem 110 has a natural mass. The second control circuit 187 is further configured to provide the second time-varying control signal to the second actuator 162 in response to the sixth signal, so that a characteristic mass of the mechanical subsystem 110 is different from the natural mass while the second time-varying control signal is applied to the second actuator 162.

In various aspects, one or both of the actuators 132, 162 is configured to apply the force to the driven mass 111 along a displacement axis (e.g., X). The driven mass 111 includes an applicator (not shown) forming an end of the driven mass 111 along the displacement axis. Such an applicator can be used to apply force to an object adjacent to the MEMS device.

In various aspects, the actuator 132 (or 162) is configured to apply the force to the driven mass 111 along a displacement axis X. The mechanical subsystem 110 includes a plurality of flexures 114 supporting the driven mass 111 and adapted to permit the driven mass 111 to translate along the displacement axis X. In various aspects, the actuator 132 (162) includes a comb drive and a voltage source. The comb drive includes plate 134 (164) attached to and movable with driven mass 111 and plate 135 substantially fixed in position. Actuator 162 can likewise include attached plate 164 and substantially-fixed plate 165.

In various aspects, multiple sensing capacitors or multiple actuators are used. The device can include either or both of additional comb drives 145, 175 having respective plates 147, 177 attached to and movable with the driven mass 111 and respective plates 149, 179 substantially fixed in position. In various aspects, a capacitance of the sensing capacitors 145, 175 varies as the driven mass 111 moves. The corresponding measurement circuits 150, 180 are further responsive to the capacitance of the sensing capacitors 145, 175 to provide any or all of the first through sixth signals. In other aspects, comb drives 145, 175 are driven by respective control circuits 186, 187 (drive path not shown) to apply forces to driven mass 111, e.g., as described above with reference to actuators 132, 162.

In various aspects, one or more of the comb drives 132, 140, 145, 162, 170, 175 is used for both sensing and actuation. Two circuits (e.g., measurement circuit 150 and control circuit 186) are connected to the same comb drive; one controls voltage and one measures capacitance.

In various aspects, bias source 199 maintains driven mass 111 at a selected potential. Bias source 199 can also include a ground tie to maintain driven mass 111 at a ground potential.

Figure 2:
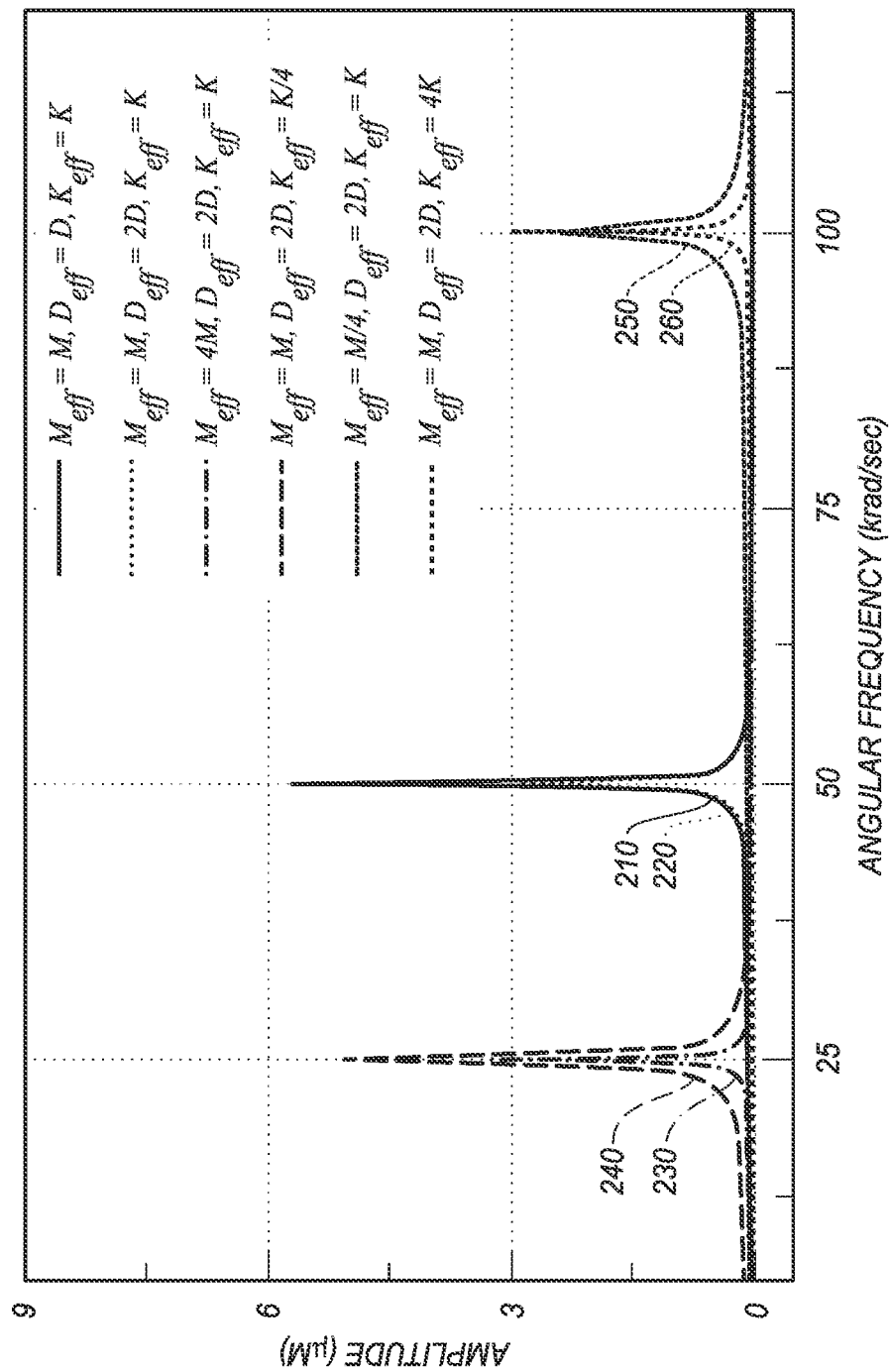
FIG. 2 is a chart showing simulated frequency response of a MEMS resonator subject to various amounts of effective mass, damping, and stiffness.

FIG. 2 is a chart showing simulated frequency response of a MEMS resonator subject to various amounts of effective mass, damping, and stiffness. Feedback forces are applied that are proportional to simulated measurements of displacement, velocity, and acceleration to control the effective (or apparent) stiffness, damping, and mass of the MEMS device. Various aspects permit compensating for the deviations occurring from process, packaging, or environmental variations. Various aspects permit causing the MEMS to behave with significantly different dynamical properties on demand. The abscissa of FIG. 1 is angular frequency in krad/s, and the ordinate is amplitude of oscillation of the simulated device in μm. In this simulation, an electrical feedback delay of 50 ns is applied. Such delays are discussed in more detail below.

Curve 210 resonates at 50 krad/s due to its mechanical mass M, damping D, and stiffness K. It represents conventional operation without feedback. Resonant frequency can be estimated as $\omega=\sqrt{(K/M)}$. Curves 220, 230, 240, 250, 260 represent the same MEMS acted upon by an electrostatic force feedback system such as that described above with reference to FIG. 1. Such a system provides a positive or negative effective mass $M_{eff}$, damping $D_{eff}$, and stiffness $K_{eff}$. Curve 220 shows $D_{eff}=2D$, reducing amplitude of oscillation without changing its frequency. Curve 230 shows $D_{eff}=2D$ and $M_{eff}=4M$. Curve 240 shows $D_{eff}=2D$ and $K_{eff}=K/4$. Curve 250 shows $D_{eff}=2D$ and $M_{eff}=M/4$. Curve 260 shows $D_{eff}=2D$ and $K_{eff}=4K$. Curves 230, 240, 250, 260 shows the ability of a system of FIG. 1 to halve (curves 230, 240; 25 krad/s) or double (curves 250, 260; 100 krad/s) its resonance frequency on demand by adjusting the first or second parameters used by control circuits 186, 187.

Prior efforts by others have touched on various aspects of electronic tuning of stiffness or electronic tuning of damping. However, prior schemes do not comprehensively tune the effective stiffness, damping, and mass. Prior schemes also do not apply feedback forces that are proportional to displacement, velocity, and acceleration.

Referring back to FIG. 1, in various aspects, the MEMS structure includes various comb drives. Comb drives 140, 170 sense motion; comb drives 132, 162 apply feedback forces, and comb drives 145, 175 apply typical drive forces. Pairs of comb drives are used so that the pulling forces of the comb drives are applied continuously throughout the motion.

In an exemplary AC-drive configuration, a sinusoidal driving force $$F_{drive}=F_0 e^{j\omega t} \quad (1)$$

is applied on the comb drives, where $F_0$ is the force magnitude, and $\omega$ is the angular driving frequency. Electric tuning of mass, damping, and stiffness is applied via electrostatic feedback force. A steady-state solution for displacement is of the form $$x=Ae^{j(\omega t-\phi)}, \quad (2)$$

where A is the amplitude and $\phi$ is the phase difference from the applied driving frequency. If the feedback mechanism is not instantaneous, a delay time $t_d$ can be included in the model. The governing equation of the system under feedback mechanism is thus $$M\ddot{x}+D\dot{x}+Kx=F_{drive}-[F_M(\ddot{x})+F_D(\dot{x})+F_K(x)] \quad (3)$$

where $F_M$, $F_D$, and $F_K$ are electrostatic feedback forces that are proportional to x, $\dot{x}$, and $\ddot{x}$, which may be delayed by time $t_d$, as $$F_K=K_e x(t-t_d),\ F_D=D_e \dot{x}(t-2t_d),\ \text{and}\ F_M=M_e \ddot{x}(t-3t_d). \quad (4)$$

The negative form of time delay is used in a nonlimiting example to shift x, ẋ, and ẍ back in time for the feedback forces, i.e. $t_d<0$.

In steady-state frequency domain, the feedback forces are $$F_K = K_e e^{-j\omega t_d} X, \ F_D = D_e e^{-j\omega 2 t_d} j\omega X, \ F_M = -M_e e^{-j\omega 3 t_d} \omega^2 X, \quad (5)$$

assuming a displacement solution of the form $$X(\omega) = A e^{j(\omega t - \varphi)} \quad (6)$$

and sinusoidal driving force of $$F_{drive} = F_0 e^{j\omega t}. \quad (7)$$

In steady-state, (3) may be expressed as $$\frac{F_0 e^{-j\phi}}{A} = -[M + M_e e^{-j3\alpha}]\omega^2 + [D + D_e e^{-j2\alpha}]j\omega + [K + K_e e^{-j\alpha}] \quad (8)$$

where $\alpha \equiv \omega t_d$. $\omega$ is in units of radians per second, and $t_d$ is in units of second, so $\omega$ is in units of radians. Eq. (8) is complex-valued in general because $j=\sqrt{-1}$, so $e^{-j\theta} = \cos -\theta + j \sin -\theta$ by Euler's formula. To examine the steady-state frequency response, the real and imaginary parts are separated:

$$\frac{F_0 \cos(\phi)}{A} = \quad (9)$$
$$-M\omega^2 + K - M_e \omega^2 \cos(3\alpha) + \omega D_e \sin(2\alpha) + K_e \cos(\alpha) \quad \text{(Real)}$$

and $$\frac{F_0 \sin(\phi)}{A} = \quad (10)$$
$$\omega D + M_e \omega^2 \sin(3\alpha) + \omega D_e \cos(2\alpha) - K_e \sin(\alpha). \quad \text{(Imaginary)}$$

Squaring and then summing (9) and (10) yields an expression for amplitude A as a function of driving frequency $\omega$:

$$A(\omega) = \frac{F_0}{\sqrt{\begin{pmatrix} \omega^2(M + M_e \cos(3\alpha)) - \omega D_e \sin(2\alpha) - \\ K - K_e \cos(\alpha) \end{pmatrix}^2 + \begin{pmatrix} \omega^2 M_e \sin(3\alpha) - K_e \sin(\alpha) + \\ \omega(D + D_e \cos(2\alpha)) \end{pmatrix}^2}}. \quad (11)$$

And the phase is found from the ratio of (10) to (9) as $$\phi(\omega) = \tan^{-1} \left( \frac{M_e \omega^2 \sin(3\alpha) - K_e \sin(\alpha) + \omega[D + D_e \cos(2\alpha)]}{\omega^2[M + M_e \cos(3\alpha)] - \omega D_e \sin(2\alpha) - K - K_e \cos(\alpha)} \right). \quad (12)$$

The value $\alpha$ in (11) and (12) If the delay in the electrical circuit is insignificant ($t_d$~0), then response of the system becomes $$A(\omega) = \frac{F_0}{\sqrt{(\omega^2 M_{eff} - K_{eff})^2 + (\omega D_{eff})^2}} \quad (13)$$

$$\phi(\omega) = \tan^{-1} \left( \frac{K_e \sin(\alpha) - \omega D_{eff}}{\omega^2 M_{eff} - K_{eff}} \right), \quad (14)$$

where the effective mass, damping, and stiffness of the electromechanical system is $$M_{eff} = M + M_e, \ D_{eff} = D + D_e, \ \text{and} \ K_{eff} = K + K_e. \quad (15)$$

Figure 3:
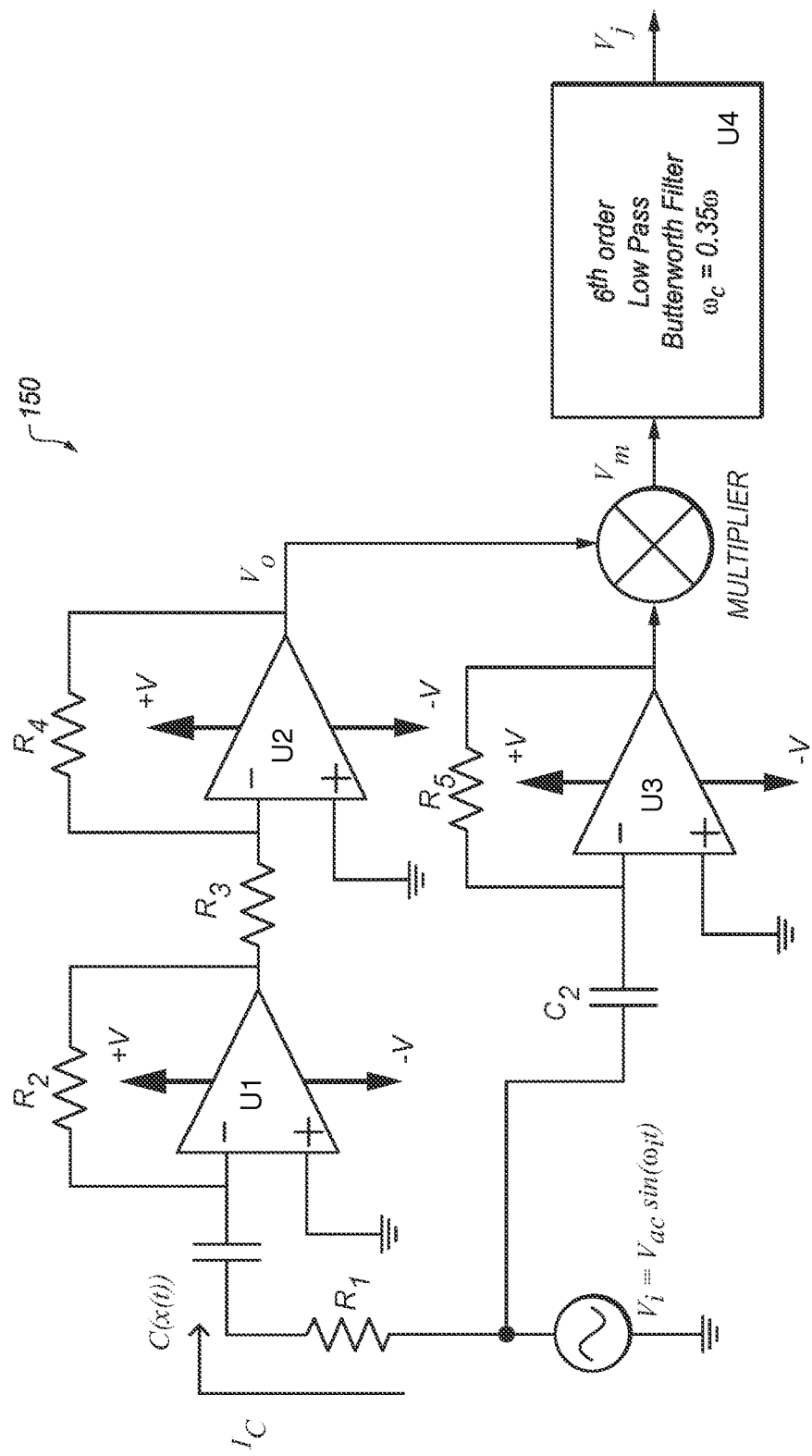
FIG. 3 is a schematic of an exemplary capacitance sensor circuit.

FIG. 3 is a schematic of an exemplary capacitance sensor circuit in measurement circuit 150 according to various aspects. It includes a trans-impedance amplifier, a demodulator circuit and a $6^{th}$ order low pass Butterworth filter with cut-off frequency $\omega_c = \omega$. In a simulated configuration, the displacement of the comb drive attached to the proof mass is denoted x. The comb drive capacitance is given by $$C(x) = \frac{2N\varepsilon h}{g}(L_0 + x) \quad (16)$$

where $L_0$ is the initial overlap of the comb fingers. An input sinusoidal signal of frequency $\omega_i$ and amplitude $V_{ac}$ biases the MEMS so that the impedance of comb drive is used. The output $V_0$ of this first stage (upper path shown) is expressed as:

$$V_0 = \frac{R_2 R_4}{R_3} \frac{1}{\sqrt{R_1^2 + \left(\frac{1}{\omega_i C}\right)^2}} V_{ac} \sin(\omega_i t - \theta) \quad (17)$$

where $\theta = -\tan^{-1}(1/\omega_i R_1 C)$. Equation (17) can be simplified using a couple of approximations. First, since the quantity $1/\omega_i R_1 C$ is very large, $\theta$ can be approximated as $-\pi/2$. Second, since the quantity $1/\omega_i C$ is much larger than $R_1$, $R_1$ can be ignored. With these approximations, (17) can be expressed as:

$$V_0 = A_1 \omega_i C V_{ac} \cos(\omega_i t). \quad (18)$$

where $A_1 = R_2 R_4 / R_3$.

The process to retrieve the displacement-dependent capacitance from (18) is now an amplitude demodulation technique. The demodulating signal $V_{ac} \cos(\omega_i t)$ is derived by differentiating the input signal $V_i$. The demodulator is shown in FIG. 3. The demodulator includes the multiplier, the differentiator opamp U3, and the filter (U4). The signal from U1 and U2 is the one being demodulated. The resistance and capacitance values of the differentiator (C2, R5, U3) can be chosen such that $R_5 C_2 \approx 1/\omega_i$ to achieve unity gain. The output of the demodulator contains two time varying terms. One of them is directly proportional to the MEMS capacitance and the other one is multiplication of MEMS capacitance and sinusoid varying at twice the input signal frequency $2\omega_i$. The two approximations made earlier allows the $\cos(2\omega t)$ quantity to very faster than C. So the term containing higher frequency component can easily be eliminated by a $6^{th}$ order Butterworth low pass filter (U4). The cut-off frequency is set to $\omega_c = 0.35 \omega_i$. Proper filtering ensures that the output of the filter stage contains only the term proportional to time varying MEMS capacitance. Thus:

$$V_f = -\omega_i A_1 V_{ac}^2 \frac{N\varepsilon h}{g}(L_0 + x). \quad (19)$$

Figure 4:
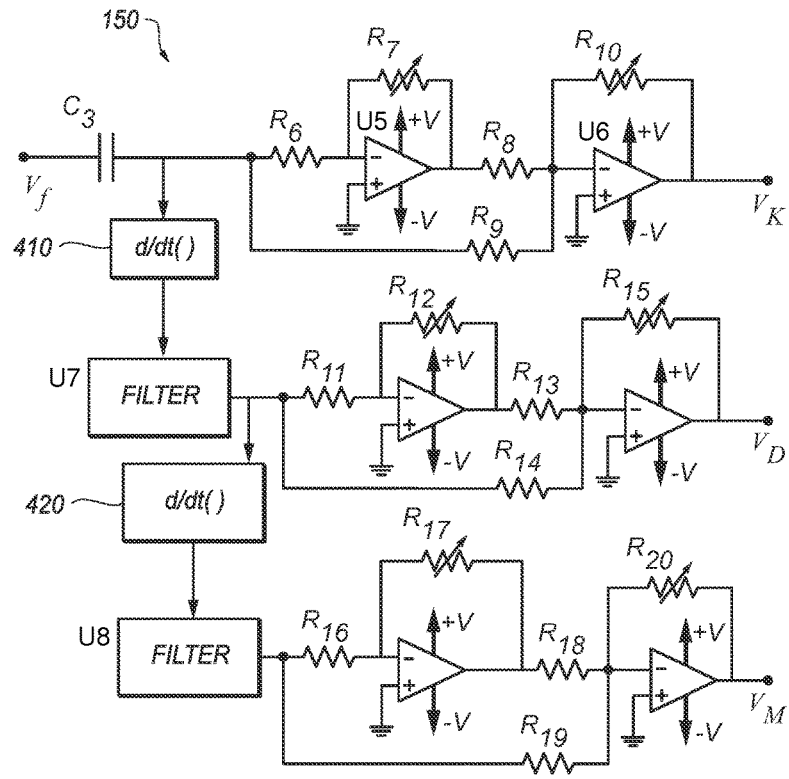
FIG. 4 is a schematic of an exemplary circuit configured to produce signals proportional to the displacement, velocity, and acceleration of a proof mass.

FIG. 4 is a schematic of an exemplary circuit in measurement circuit 150 configured to produce signals proportional to the displacement, velocity, and acceleration of a proof mass. In examples such as that shown, measurement circuit 150 includes a differentiator 410 configured to receive a signal corresponding to the capacitance of the sensing capacitor and provide the second signal corresponding to the velocity.

Specifically, the circuit of FIG. 4 receives $V_f$ from the circuit shown in FIG. 3. The signal $V_f$ is then passed through capacitor $C_3$ to attenuate or suppress the dc term and produce a signal $V_K$ proportional to displacement. This signal is passed through a differentiator 410 to produce a signal proportional to velocity and this signal is further passed through another differentiator 420 to produce a signal proportional to acceleration. Each of the signals is passed through amplifiers that invert and amplify the signal. Each differentiated signal is passed through a filter (U7, U8) to reduce noise. For the signal $V_K$, the amplifier includes R6, R7, R8, R9, R10, U5, and U6. The corresponding output voltages for stiffness, damping, and mass are:

$$V_K = \omega_i A_1 V_{ac}^2 \left(\frac{N\varepsilon h}{g}\right)\left(1 - \frac{R_7}{R_6}\right)\frac{R_{10}}{R_9}x, \quad (20)$$

$$V_D = \omega_i A_1 V_{ac}^2 \left(\frac{N\varepsilon h}{g}\right)\left(1 - \frac{R_{12}}{R_{11}}\right)\frac{R_{15}}{R_{14}}\dot{x}, \quad (21)$$

and $$V_M = \omega_i A_1 V_{ac}^2 \left(\frac{N\varepsilon h}{g}\right)\left(1 - \frac{R_{17}}{R_{16}}\right)\frac{R_{20}}{R_{19}}\ddot{x}. \quad (22)$$

Figure 5:
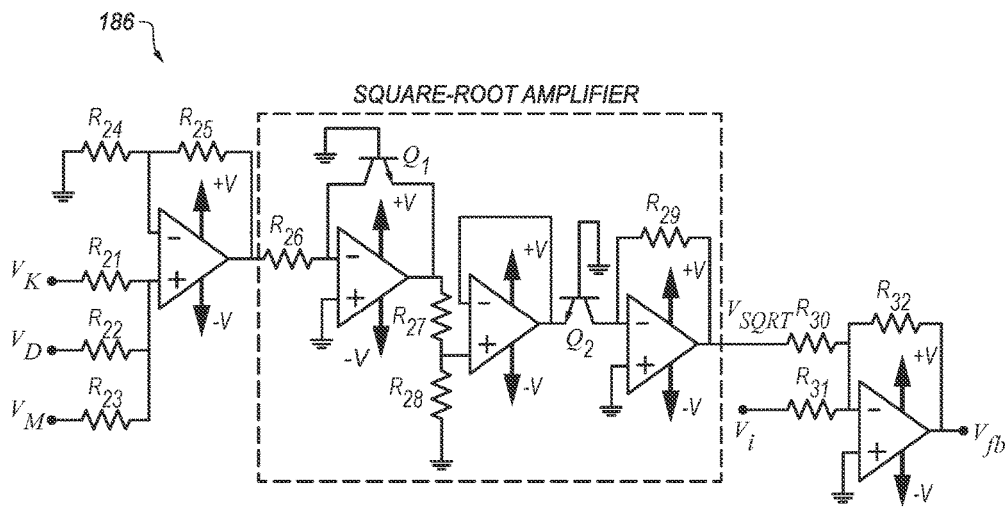
FIG. 5 is a schematic of an exemplary circuit configured to carry out addition and square-root operations.

FIG. 5 is a schematic of an exemplary circuit in control circuit 186 configured to carry out addition and square-root operations to create the corresponding forces for these voltages. The voltages are combined through an adder circuit and then the sum is square rooted using a square-root amplifier. The square root amplifier is designed such that it performs the square roots if the voltage is positive, and it returns zero if the voltage is negative. The square root amplifier with unity gain is implemented with a logarithmic amplifier, voltage divider, and an anti-logarithmic amplifier. The desired feedback signal from this signal is given by $$V_{fb} = \sqrt{V_M + V_D + V_K} + V_i. \quad (23)$$

This signal is applied to the comb drives of the device, e.g., of FIG. 1. Feedback can be applied symmetrically to both sides of the device, or applied only to one side. The feedback force is:

$$F_{fb} = \frac{1}{2}\frac{2N\varepsilon h}{g}(V_{fb} - V_i)^2 = \frac{N\varepsilon h}{g}[V_M + V_D + V_K]. \quad (24)$$

Substituting (20), (21), (22), and (23) into (24), forces proportional to mass, velocity, and displacement are determined:

$$F_{fb} = M_e\ddot{x} + D_e\dot{x} + K_e x \quad (25)$$

where $$M_e = \omega_i A_1 V_{ac}^2 \left(\frac{N\varepsilon h}{g}\right)\left(1 - \frac{R_{17}}{R_{16}}\right)\frac{R_{20}}{R_{19}} \quad (26)$$

$$D_e = \omega_i A_1 V_{ac}^2 \left(\frac{N\varepsilon h}{g}\right)\left(1 - \frac{R_{12}}{R_{11}}\right)\frac{R_{15}}{R_{14}}, \quad (27)$$

and $$K_e = \omega_i A_1 V_{ac}^2 \left(\frac{N\varepsilon h}{g}\right)\left(1 - \frac{R_7}{R_6}\right)\frac{R_{10}}{R_9}. \quad (28)$$

Figure 6A:
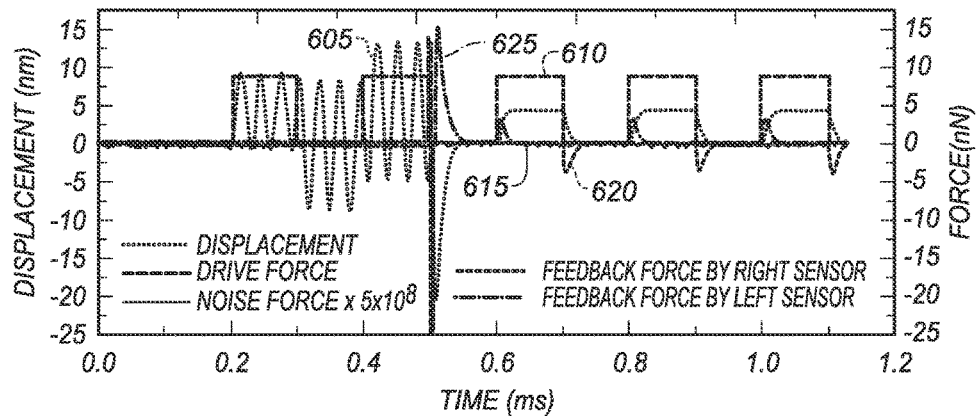
FIGS. 6A-6C show simulated effects of electrical damping on response of an exemplary MEMS comb drive.
Figure 6B:
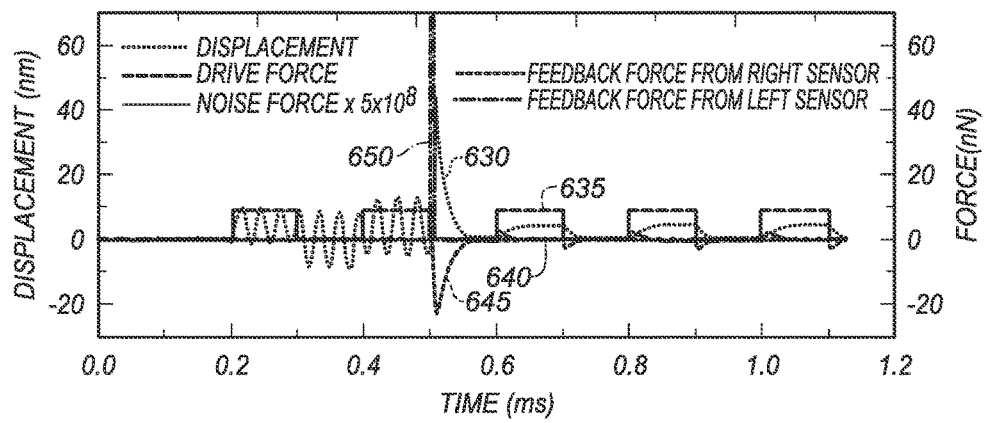
Figure 6C:
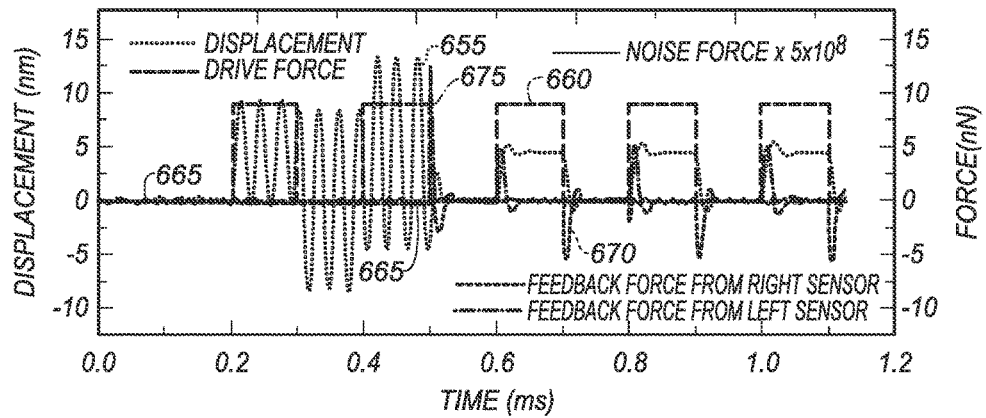

FIGS. 6A-6C show simulated effects of electrical damping on response of an exemplary MEMS comb drive. Using the circuit models above, the MEMS device was simulated subject to driving force, feedback forces, and random white noise to emulate small noise sources. The effect of circuit delay is inherent to the circuit models. The maximum delay time is about ~100 ns for circuit parameters. The input signal amplitude and frequency are $V_i$=1V and $\omega_i$=1 GHz. Specifically, there is shown the effect of electrical damping $D_e$ on response of a MEMS comb drive under (FIG. 6A) critically damped, (FIG. 6B) over damped, and (FIG. 6C) under damped conditions.

In all transient simulation examples, noise is always active and a square wave drive force is turned on at t=0.2 ms. The effect of various feedbacks is explored separately. Resistors $R_7$ and $R_{10}$ are controlled to modulate the effective damping of the system and drive the system into over, under, and critically damped conditions. The feedback for electrical control of damping is starts at t=0.5 ms. It can be seen from FIGS. 6A-6C that the noisy response is reduced when the feedback is activated and the effective damping of the system increased. Under damped conditions, oscillatory behavior remains due to noise (FIG. 6C).

In a simulation to test the effect of electrical mass $M_e$ and stiffness $K_e$ on the MEMS performance, the electrostatic feedback force for mass and stiffness control is turned on at t=0.2 ms along with the square wave excitation force. The frequency of vibration due to thermal force is changed due to modulation of effective mass or stiffness (see FIGS. 7A-8B). This is because the feedback mechanism changed the resonant frequency of the system. Thus the simulation result indicates that the active control of device parameters successfully control the resonant frequency of the system. This can advantageously increase the performance of sensors which are based on sensing the resonant frequency, such as mass sensing or chemical detection.

Figure 7A:
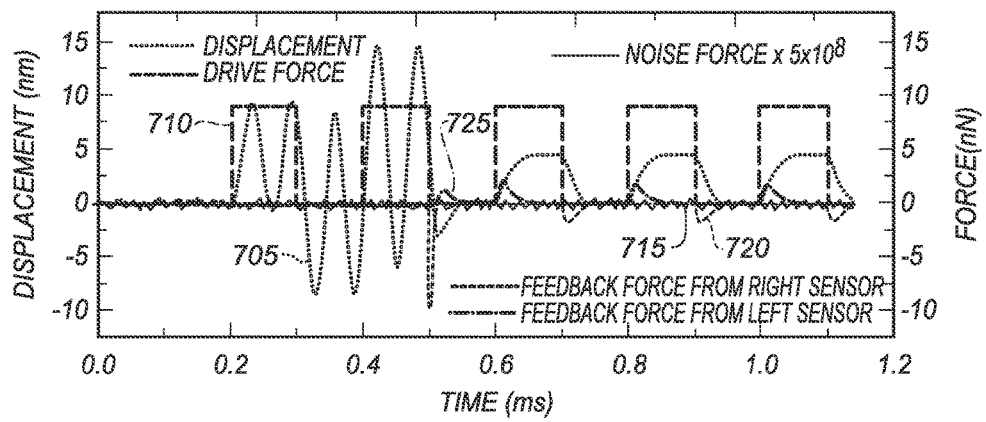
FIGS. 7A-7B show simulated effects of electrical mass on the performance of an exemplary MEMS comb drive.
Figure 7B:
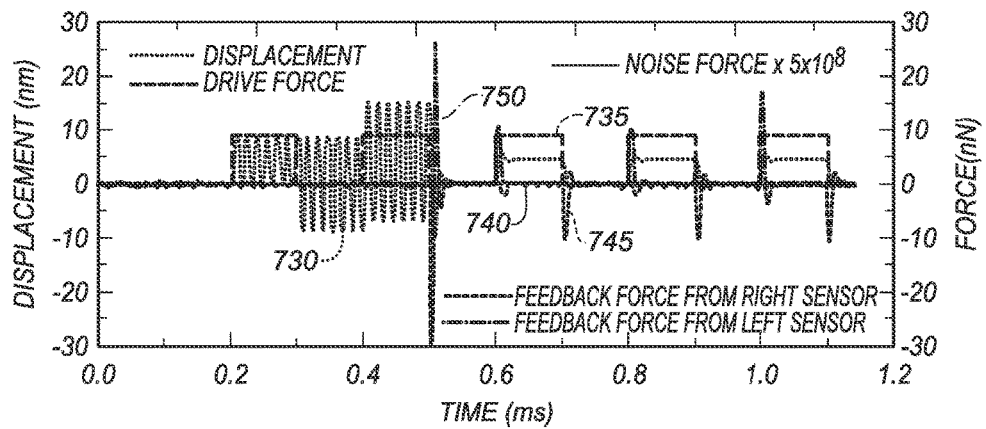

FIGS. 7A-7B show simulated effects of electrical mass on the performance of an exemplary MEMS comb drive. Simulation parameters are as described above with reference to FIGS. 6A-6C. Specifically, there is shown the effect of electrical mass $M_e$ on the performance of a MEMS comb drive when effective mass of the proof mass (driven mass 111) is (FIG. 7A) four times the mechanical mass, and (FIG. 7B) one fourth of the mechanical mass.

Figure 8A:
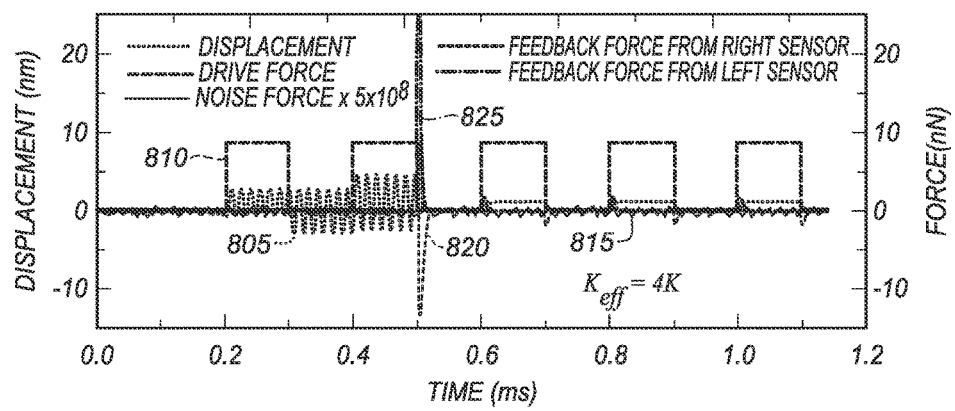
FIGS. 8A-8B show simulated effects of electrical stiffness on the performance of an exemplary MEMS comb drive.
Figure 8B:
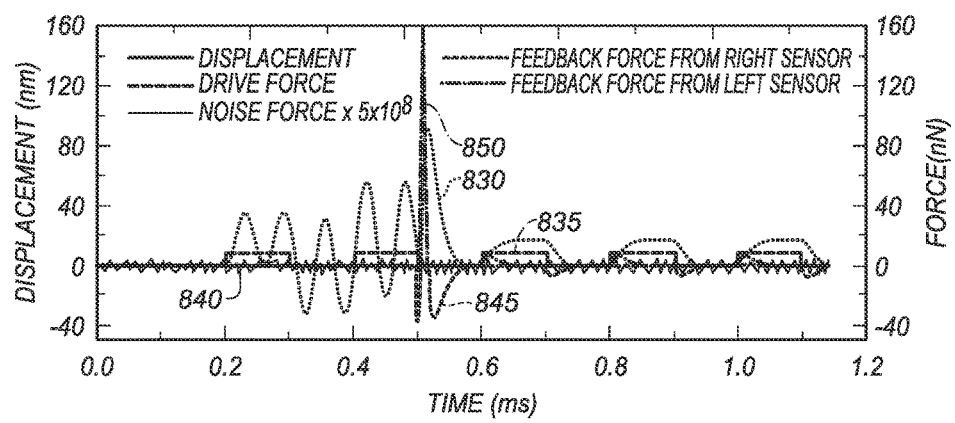

FIGS. 8A-8B show simulated effects of electrical stiffness on the performance of an exemplary MEMS comb drive. Simulation parameters are as described above with reference to FIGS. 6A-6C. Specifically, there is shown the effect of electrical stiffness $K_e$ on the performance of a MEMS comb drive when effective stiffness of the proof mass is (FIG. 8A) four times the mechanical stiffness, and (FIG. 8B) one fourth of the mechanical stiffness.

Figure 9A:
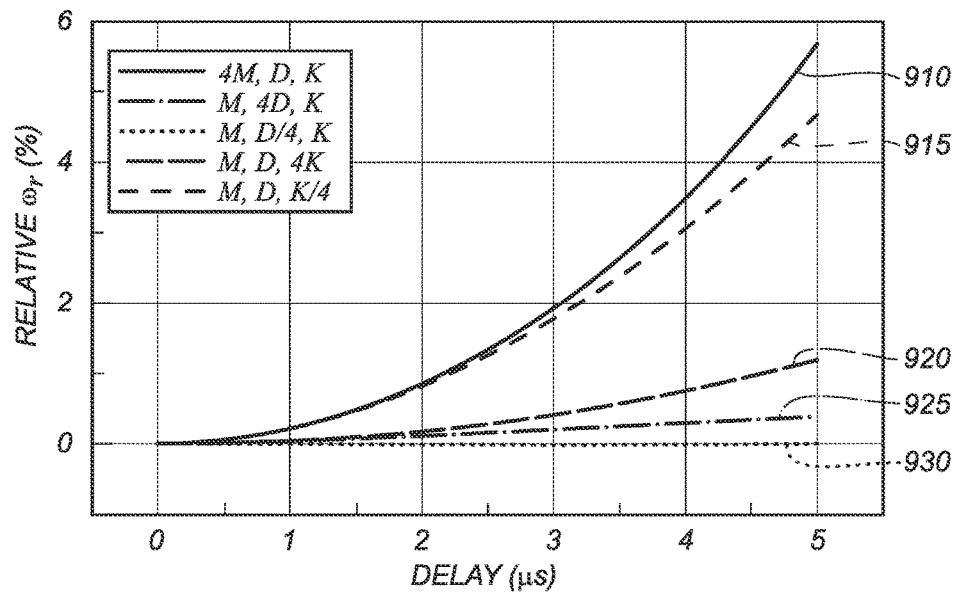
FIGS. 9A-9B show simulated effects of time delay in the feedback loop on resonance frequency and amplitude of an exemplary MEMS device.
Figure 9B:
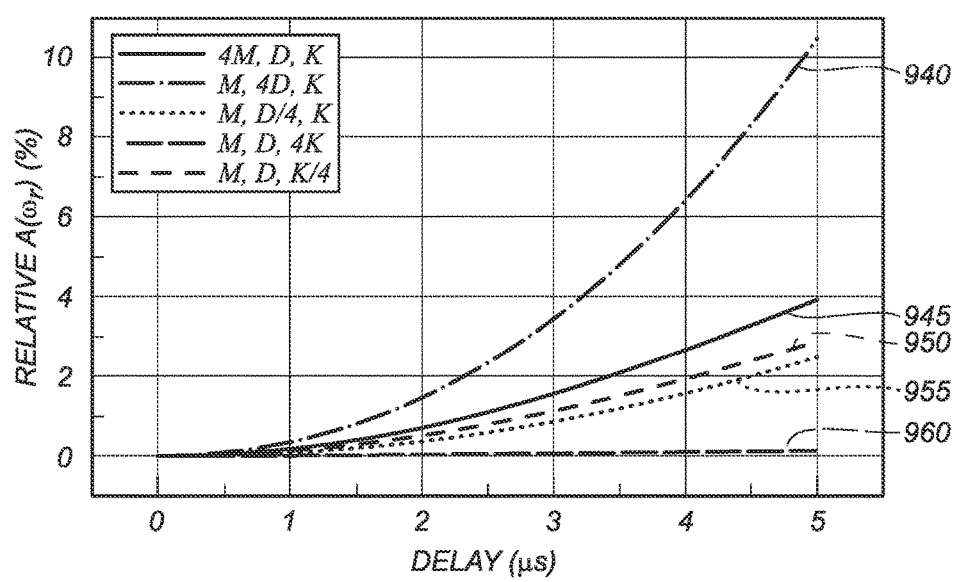

FIGS. 9A-9B show simulated effects of time delay in the feedback loop on resonance frequency and amplitude of an exemplary MEMS device. Simulation parameters are as described above with reference to FIGS. 6A-6C. Specifically, there is shown relative changes in resonant frequency $\omega_r$ as delay increases.

In general, design parameters to consider for feedback forces for effective mass, damping, and stiffness can include one or more of time delay $t_d$, the +/− sign of the feedback forces, and their magnitudes. Data represented in FIGS. 9A-9B was simulated holding geometric and material properties constant while considering issues of time delay, magnitude, and direction. The microstructure simulated has 100, 2 μm gap comb fingers with a thickness of 20 μm, mass M=8×10$^{-10}$ kg, damping D=1.55×10$^{-7}$ Ns/m, and stiffness K=2 N/m.

Time delay $t_d$ is due to the effective RC time constant of various stages in the electronic control system of the MEMS. One proposed electrical system is described above. The equations given above with respect to FIG. 4 assume the time delay is an additional $t_d$ for each stage. I.e. $1t_d$ for the displacement stage, $2t_d$ for velocity stage, and $3t_d$ for the acceleration stage. The delay can range from a few nanoseconds to a few microseconds depending on the circuit design. For some microstructures that has a purely mechanical frequency of tens of kHz, if $t_d$ is on the order of tens of nanoseconds then the delay can be disregarded. However, larger delays can affect the amplitude and resonance frequency.

The effect of delay can be seen in FIGS. 9A-9B. The relative resonance frequency increases with delay as seen from FIG. 9A. The relative frequency is calculated as $$[\omega_r(t_d<0)-\omega_r(t_d=0)]/\omega_r(t_d=0). \tag{29}$$

The deviation due to delay is larger for mass control. The relative frequency due to delay is larger if increasing the stiffness than if decreasing the stiffness. The delay in feedback control of damping has lowest effect in relative frequency (deviation is ~0.07%). The largest deviation in resonant frequency is ~6% at a large circuit delay of ~5 μs.

Similar deviation due to delay can be observed for maximum amplitude of response (in % at resonant frequency). The relative maximum amplitude is calculated as $$[A(\omega_r(t_d<0))-A(\omega_r(t_d=0))]/A(\omega_r(t_d=0)). \tag{30}$$

The effect of delay in maximum amplitude is prominent for feedback control for damping. Mass control is also affected due to delay. The effect of delay in relative amplitude has lowest (deviation~0.04%) effect on the stiffness control. The maximum deviation is in the order of ~10% for a large circuit delay of ~5 μs.

The sign of the electrical mass $M_e$, damping $D_e$, and stiffness $K_e$ can be chosen to be positive or negative depending on the desire to increase or decrease the effective mass, damping, or stiffness. For instance, if the goal is to reduce the system mass by a factor of 4 of the purely mechanical mass M, then $M_e$ should be −0.75M, such that $M_{eff}$=(M+$M_e$)=(M+−3M/4)=M/4. A negative feedback force simply opposes the direction of displacement, velocity, or acceleration. Since comb drives only pull on the proof mass, only one side of a pair of comb drives operates at any one time. So a negative force implies that a pulling force is applied 180 degrees out of phase. As shown in FIG. 2, (11) is used with a time delay of 50 ns to increase or decrease the effective mass, damping, and stiffness of the system.

In an example, the actuators are driven so $K_{eff}$≈0, i.e., $K_e$≈−K. This is as if the actuator were floating, and can provide, e.g., an accelerometer that is much more sensitive for gravity or acceleration measurements than accelerometers with a positive stiffness. However, delay time interferes with matching, as shown here, so it is desirable to reduce time delay.

The maximum comb drive force limits the range of dynamical control. The maximum electrical stiffness, damping, and stiffness for exemplary aspects are:

$$K_{e,max} = \frac{N\varepsilon h}{gA} V_{max}^2 \tag{31}$$

$$D_{e,max} = \frac{N\varepsilon h}{gA} \frac{V_{max}^2}{\omega}$$

$$M_{e,max} = \frac{N\varepsilon h}{gA} \frac{V_{max}^2}{\omega^2}$$

where N is the number of comb fingers, ε is the permittivity of the medium, h is the layer thickness, g is the gap between fingers, and maximal values of displacement A, velocity ωA, and acceleration ω$^2$A are considered. Using values of the above-noted test case at a breakdown voltage of 200V, $K_e$/K=O(10), $D_e$/D=O(1000), $M_e$/M=O(10).

Negative feedback forces in a given direction can be applied as positive feedback forces in the opposite direction. For very high Q, positive feedback can be used to pump energy back into the system to, e.g., overcome air resistance. The parameters defining the effective mass, damping, and stiffness can be changed over time to achieve nonlinear effects. For example, oscillating the stiffness value over time can cause the driven mass 111 to operate at a corresponding frequency. Slewing the stiffness also permits causing a MEMS device to behave as a nonlinear oscillator, e.g., a small-deflection nonlinear oscillator exhibiting hysteresis. Other nonlinear effects can be introduced or compensated for. According to various aspects, a single One physical design of a MEMS device can be fabricated and then used in many different applications by adjusting the effective parameters. For example, a single physical device could serve as a resonator, gyroscope, static deflection element, or accelerometer depending on the effective parameters.

Various aspects above include a comprehensive electrostatic force feedback mechanism that permits active dynamical control of the effective mass, damping, and stiffness of a MEMS device by applying feedback forces that are proportional to displacement, velocity, and acceleration of its proof mass. Such a feedback system can be used to change the characteristics of MEMS devices on demand. Electrostatic damping can advantageously reduce the passive vibrations of MEMS due to noise. Such control in performance is important due to the systemic variation in performance caused by process variations, packaging stresses, thermal drift, energy losses, and noise sources.

Prior efforts by others have used feedback forces based on position or velocity to modify bandwidth, frequency, quality factor, and the sensitivity of resonators. Various aspects herein provide comprehensive control over the effective mass, damping, and stiffness simultaneously. Electrical emulations of mass, damping, and stiffness may be positive or negative, and they can be larger than their purely mechanical counterparts. Effective mass and stiffness can be increased by an order of magnitude, and damping can be increased by three orders of magnitude.

As noted above, various attempts have been made to adjust or analyze the design of MEMS structures with regards to sensitivity to parameters. Examples of parameters include lengths, widths, and thicknesses of MEMS structures, which are subject to process variations during fabrication. Other examples include inputs, such as driving voltages or currents. For example, a MEMS driver integrated circuit might output a nominal 10 V with a range of ±0.1 V. This variation in voltage can cause the performance of the device to vary. Variations in the environment around the device can also be parameters. Ambient temperature, junction temperature, audio-frequency noise transmitted to the MEMS device by conduction through the substrate, or other vibrations, shocks, or other mechanical energy transmitted to the MEMS device can all be parameters. For example, for an accelerometer to be used in a seismograph, it might be desirable to minimize the variation in performance with respect to coarse motion at frequencies and amplitudes commonly associated with earthquakes.

Figure 10:
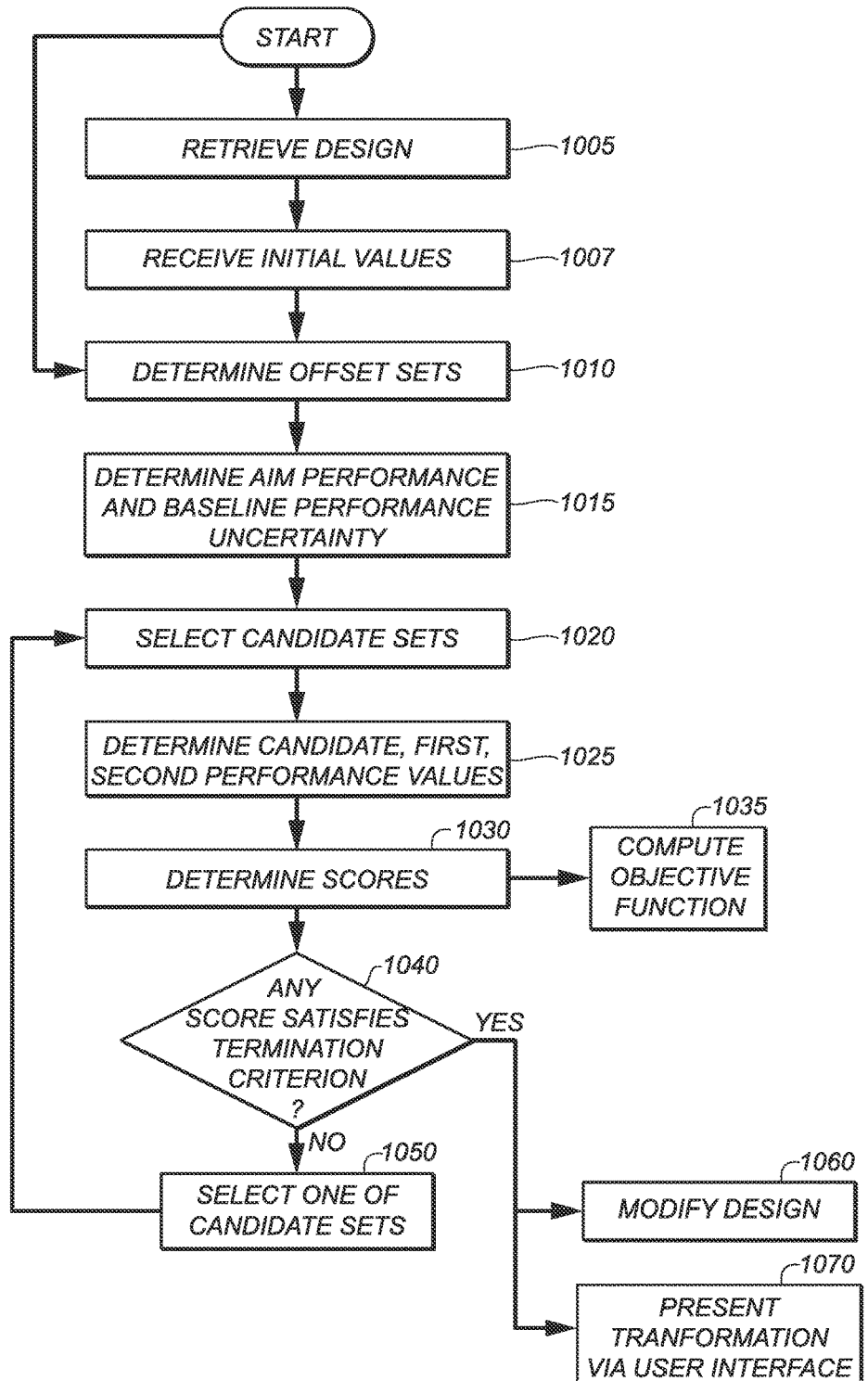
FIG. 10 is a flowchart showing exemplary methods of transforming a microelectromechanical-systems (MEMS) device design.

FIG. 10 is a flowchart showing exemplary methods of transforming a microelectromechanical-systems (MEMS) device design. The steps can be performed in any order except when otherwise specified, or when data from an earlier step is used in a later step. No requirement for a particular order shall be inferred from any claim letter or other identifying mark in any claim in this application. In at least one example, processing begins with step 1005 or step 1010. For clarity of explanation, reference is herein made to various components shown in FIG. 1 that can carry out or participate in the steps of the exemplary method. It should be noted, however, that other components can be used; that is, exemplary method(s) shown in FIG. 10 are not limited to being carried out by the identified components.

Specifically, FIG. 10 shows exemplary methods of transforming a microelectromechanical-systems (MEMS) device design with respect to a set of one or more parameters having selected initial values. The method can include automatically performing the following steps using a processor, e.g., in control circuit 186, 187 (FIG. 1). The one or more parameters can include, e.g., a width or a length of an element of the device, or a force to be applied to an element of the device. The design can be transformed to exhibit reduced variation in, e.g., static deflection or resonant frequency mode.

Figure 18:
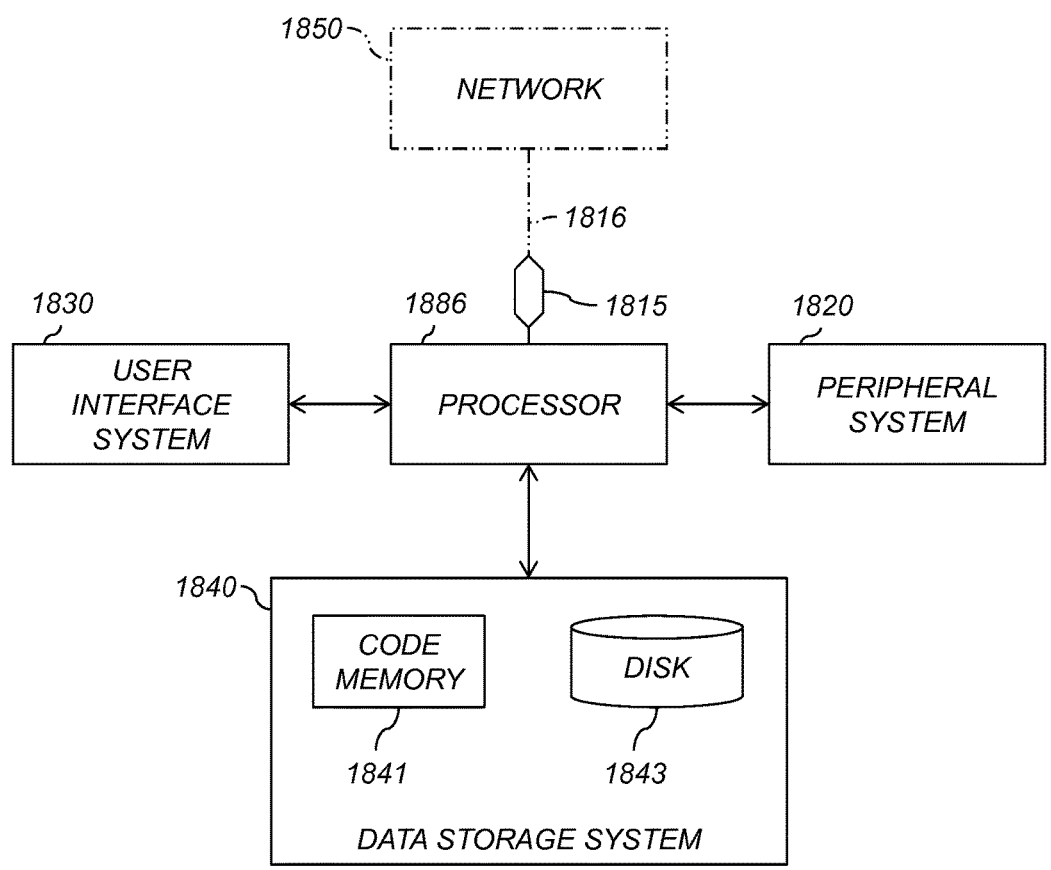
FIG. 18 is a high-level diagram showing components of a data-processing system.

In step 1005, a design of the MEMS device is retrieved by processor 1886 (FIG. 18) from a tangible, non-transitory computer-readable storage medium (e.g., disk 1843, FIG. 18). Step 1005 can be followed by step 1007. The design can be represented as, e.g., a SUGAR netlist including information about geometry, connectivity (mechanical and electrical), or materials.

Figure 12:
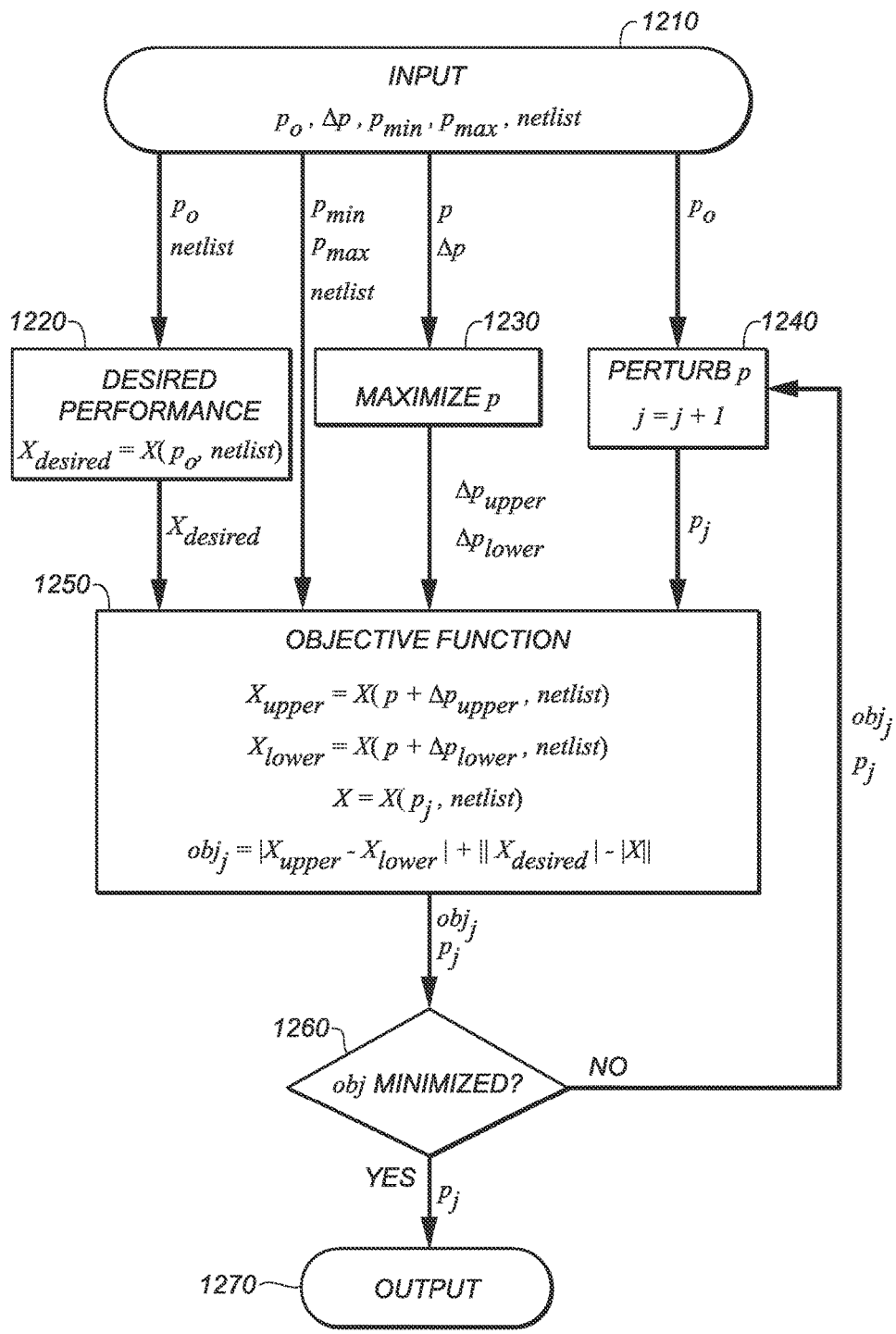
FIG. 12 is a flowchart showing exemplary ways of mathematically optimizing parameters to reduce performance variation.

In step 1007, the selected initial values are received via a user interface operatively connected to the processor. Examples of such user interfaces are discussed below with reference to FIGS. 15-17. Examples of selected initial values are discussed below with reference to block 1210 (FIG. 12).

Designs and initial values can also be received or retrieved in other ways than those described above with reference to steps 1005 and 1007. Processing continues with step 1010 once the design and initial values are available.

In step 1010, using selected uncertainty values of the parameters, first and second parameter offset sets ($\Delta p_{upper}$ and $\Delta p_{lower}$) of the design are automatically determined. This is discussed below with reference to step 1230 (FIG. 12).

Figure 11:
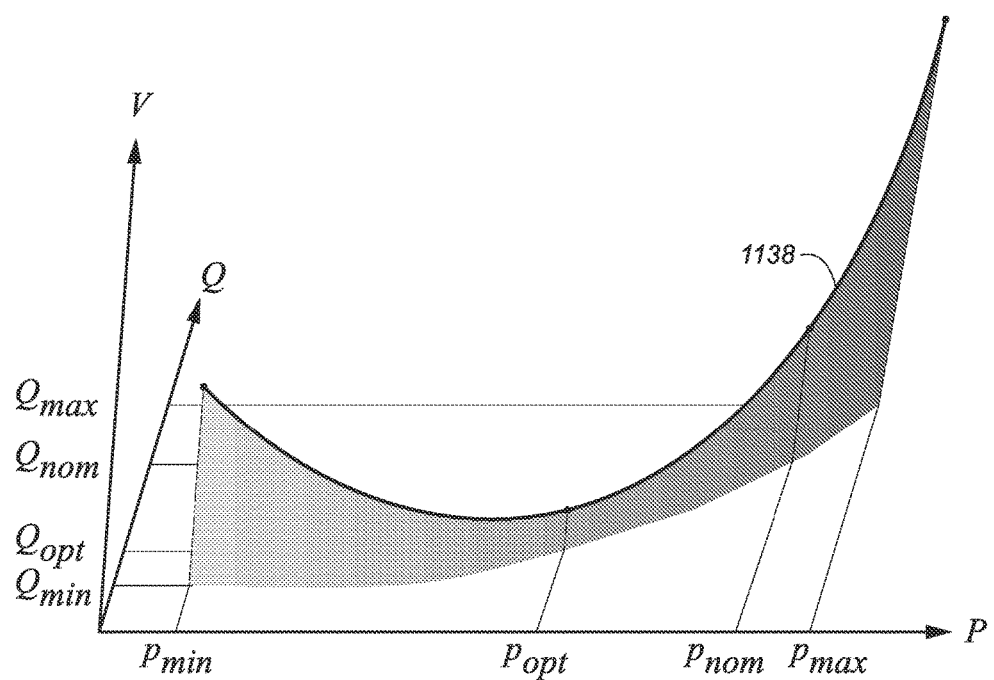
FIG. 11 is a graphical illustration of identification of a preferred set of design parameters that reduces the variation in performance about the desired performance.

In step 1015, using the selected initial values of the parameters and the first and second parameter offset sets, an aim performance value of the design is determined. A baseline performance uncertainty of the design is also determined. These can be determined, e.g., via SUGAR simulation of the design with the initial parameters. In the context of FIG. 11 (discussed below), the aim performance value constrains curve 1138 in the P-Q plane and the baseline uncertainty is the V value at ($p_{nom}$, $Q_{nom}$). In various aspects, this step also includes processing described below with reference to step 1230 (FIG. 12).

Figure 13:
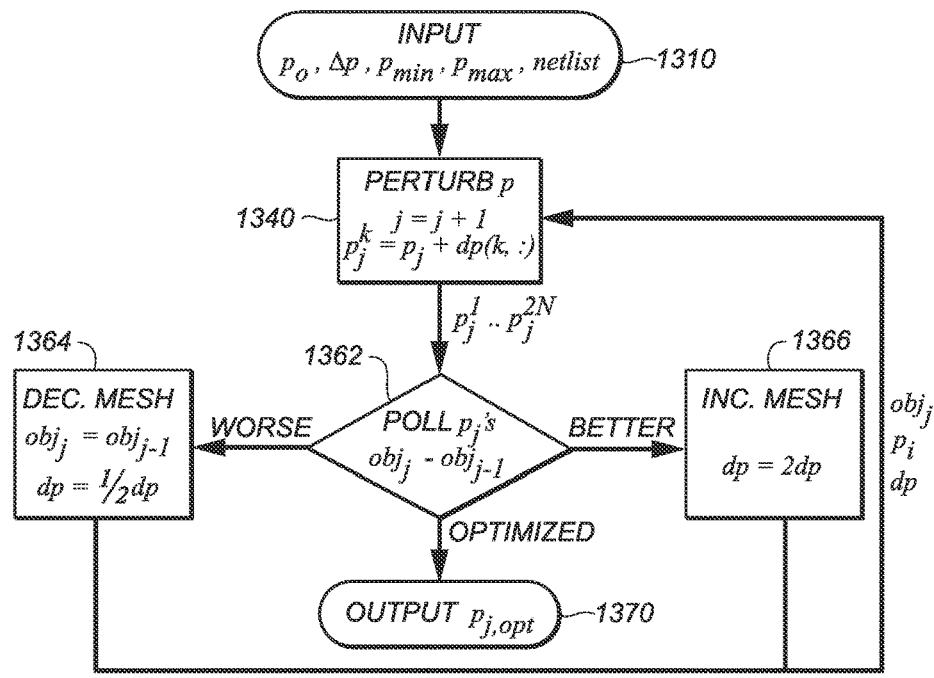
FIG. 13 is a flowchart showing an exemplary generalized pattern search (GPS) algorithm.

In step 1020, which can be referred to as a "setup step," a plurality of candidate sets of parameter values are selected using the initial values. This can further includes selecting the plurality of candidate sets using selected respective limits ($\Delta p$, $\Delta q$) for the parameters. This is discussed below with reference to step 1340 (FIG. 13).

In step 1025, a respective candidate performance value of the design is determined for each of the candidate sets. This is discussed below with reference to step 1250 (FIG. 12), where the candidate performance value is denoted X.

Also in step 1025, the first and second parameter offset sets are applied to each of the candidate sets and respective first and second performance values of the design are determined. This is also discussed below with reference to step 1250 (FIG. 12), where the first and second performances value are denoted $X_{upper}$ and $X_{lower}$.

In step 1030, which can be referred to as a "scoring step," a respective score of each of the candidate sets is determined using the aim performance value, the respective candidate performance value, and the respective first and second performance values. This is discussed below with reference to step 1250 (FIG. 12), where the score is the value of the objective function obj. Step 1030 can include step 1035 and is followed by decision step 1040.

In step 1035, an objective function of a first difference between the respective candidate performance value and the aim performance value, and of a second difference between the respective first performance value and the respective second performance value, is computed. The objective function can weight the first and second differences equally or differently. This is also discussed below with reference to step 1250.

In decision step 1040, which can be referred to as a "testing step," it is determined whether any of the respective scores satisfies a selected termination criterion. If none does, the next step is step 1050. Otherwise, the next step is step 1060 or step 1070. Termination criteria are discussed below with reference to decision step 1260 (FIG. 12) and decision step 1362 (FIG. 13).

In step 1050, one of the candidate sets is selected for use in place of the initial values. Step 1050 is followed by step 1020. In this way, steps 1020-1040 are repeated using successive selected ones of the candidate sets in place of the initial values. When the score of a candidate set satisfies the termination criterion, that one of the candidate sets is selected as a transformation of the design, and the transformed design has the respective candidate performance value corresponding to the aim performance value and the respective first and second performance values closer to each other than the baseline performance uncertainty. This can be, e.g., a mathematical optimization process. As used herein, the term "optimization" does not require the best performance physically possible be obtained. Mathematical optimization can lead to either local or global minima or maxima being selected.

In various aspects, decision step 1040 is followed by step 1060. In step 1060, the design is automatically modified to include the transformation. This can be done by textual or other transformation of the SUGAR netlist or another representation of the design.

In various aspects, decision step 1040 is followed by step 1070. In step 1070, the transformation is presented via a user interface, e.g., user interface system 1830 (FIG. 18). Examples of presentations of the transformation are discussed below with reference to FIGS. 16 and 17.

FIG. 11 is a graphical illustration of identification of a preferred set of design parameters that reduces the variation in performance about the desired performance. Design parameters P and Q represent a set of parameters to be swept; $p_{min}$, $p_{max}$, $Q_{min}$, and $Q_{max}$, are the limits of their ranges; and $p_{nom}$ and $Q_{nom}$ are the original nominal parameters that identify the desired performance. Curve 1138 that resides on the PQ-plane is an 'equi-performance' contour, where the set of parameter values that satisfy each point on the curve achieve identical performance results. The height in the out-of-plane z-axis direction represents the size of the simulated variation in performance at each point on this equi-performance contour. The variation in performance is due on the expected variation in geometric and material properties of each parameter. This analysis results in a set of new optimized parameters $p_{opt}$, $Q_{opt}$ that reduce the MEMS sensitivity to process variations. As illustrated in FIG. 1, the optimal parameters result in a smaller variation in performance (lower V) than the original nominal parameters.

FIG. 12 is a flowchart showing exemplary ways of mathematically optimizing parameters to reduce performance variation. As noted above, steps can be performed in any order unless limited, and identified components used for purposes of discussion are not limiting. Processing using the inputs shown in block 1210 begins with step 1220 or 1230.

Block 1210 represents the inputs to the process. The input configuration of the MEMS to be optimized is given by a parameterizable SUGAR netlist. (SUGAR is a MEMS simulation tool; the SUGAR netlist specifies the elements of the device and their dimensions and arrangements.) Also given are a set of initial parameters $p_0$, uncertainties or variations of the parameters $\Delta p$, and a set of practical intervals that bounds the searchable design space $[p_{min}, p_{max}]$. All these quantities can be vectors.

In step 1220, the desired performance $X_{desired}$ is determined by simulating the netlist subject to an initial set of parameters $p_0$. That is, $X_{desired}=X(p_0)$. As the algorithm searches for a new set of parameters $p_j$ that yields a smaller variation in performance, parameters $p_j$ must also satisfy the desired performance, $\|X(p_j)|-|X_{desired}\|\approx 0$.

In step 1230, there is determined a set of variations ($\Delta p_{upper}$, $\Delta p_{lower}$) that will yield the largest performance variations $|X_{j,upper}-X_{j,lower}|$ for each new parameter $p_j$ throughout the search. That is, for each $p_j$, $X_{j,upper}=X(p_j+\Delta p_{upper})$ and $X_{j,lower}=X(p_j+\Delta p_{lower})$.

Specifically, to find the set $\Delta p_{upper}$ and $\Delta p_{lower}$ that applies to all $p_j$, it can be assumed that there is an optimal sequence of + or − operations (signs) that may be applied on the elements of set $\Delta p$ that maximizes the variation in performance. Thus:

$$p_j + \mathrm{signs}_{upper}\Delta p = \begin{bmatrix} p_j(1) \\ p_j(2) \\ \vdots \\ p_j(N) \end{bmatrix} + \begin{bmatrix} +1 & & & \\ & -1 & & \\ & & \ddots & \\ & & & -1 \end{bmatrix}\begin{bmatrix} \Delta p(1) \\ \Delta p(2) \\ \vdots \\ \Delta p(N) \end{bmatrix} \quad (32)$$

and $$p_j + \mathrm{signs}_{lower}\Delta p = \begin{bmatrix} p_j(1) \\ p_j(2) \\ \vdots \\ p_j(N) \end{bmatrix} + \begin{bmatrix} +1 & & & \\ & +1 & & \\ & & \ddots & \\ & & & -1 \end{bmatrix}\begin{bmatrix} \Delta p(1) \\ \Delta p(2) \\ \vdots \\ \Delta p(N) \end{bmatrix}, \quad (33)$$

where the diagonal matrices containing the sequence of +1's and −1's are identified as $\mathrm{signs}_{upper}$ and $\mathrm{signs}_{lower}$. The upper and lower bounds on the performances are $X_{j,upper}=X(p_j+\Delta p_{upper})$ and $X_{j,lower}=X(p_j+\Delta p_{lower})$, which yield the largest variations $|X_{j,upper}-X_{j,lower}|$ for each set of parameters $p_j$.

In an example, a flexure has a width and a length. Stiffness of the flexure decreases as the width decreases or the length increases. Step 1230 includes automatically determining, e.g., via simulation, which parameters to increase and which to decrease to move the performance in a certain direction.

After step 1230, candidate sets can be determined by applying the variations to the initial parameters. Candidate sets are discussed above with reference to step 1020 (FIG. 10). Each candidate set can be represented as a single point in the configuration space of the device. For convenience, the following quantities are defined:

$$X_{upper}=X(p+\mathrm{signs}_{upper}\Delta p, \mathrm{netlist}) \quad (34)$$

$$X_{lower}=X(p+\mathrm{signs}_{lower}\Delta p, \mathrm{netlist}) \quad (35)$$

In step 1250, an objective function is evaluated to find the set of parameters $p_j$ that yields a smallest largest variation in performance:

$$\min |X_{upper}-X_{lower}| \quad (36)$$

while satisfying the desired performance $$\min \||X_{desired}|-|X(p_j)|\|. \quad (37)$$

In various aspects, the objective function is:

$$\mathrm{obj}=|X_{upper}-X_{lower}|+\||X_{disired}|-|X|\|. \quad (38)$$

The objective function value represents the bounds of expected performance for a given parameter set, given the expected variation. In some examples, $X_{desired}\approx X$ and $X_{upper}\neq X_{lower}$. The objective function can apply different weights, or equal, nonunity weights, to the two halves:

$$\mathrm{obj}=a|X_{upper}-X_{lower}|+b\||X_{desired}|-|X|\| \quad (39)$$

where $a\neq b$ or $a\neq 1$ or $b\neq 1$. For example, the increase of the mesh size in step 1366 (FIG. 13) can be considered as a weight change. In that step, weight changes of, e.g., 2× or 10× can be used.

A respective objective function value is computed for each candidate parameter set (steps 1025 and 1030, FIG. 10). The candidate performance value is X, and the first and second performance values are $X_{upper}$ and $X_{lower}$.

In decision step 1260 (corresponding to step 1040, FIG. 10), it is determined whether the objective function obj has been minimized. If so the next step is step 1270, in which the parameter values $p_j$ that correspond to the minimization of obj are output. These values can be provided, e.g., to steps 1060 or 1070 (both FIG. 10). Examples of criteria for determining when obj has been minimized are discussed below with reference to decision step 1362 (FIG. 13). If obj has not been minimized, the next step is step 1240. In this way, in various aspects, the algorithm moves the parameters starting from $p_0$ to the nearest local minimum in the configuration space. The method can be repeated with different $p_0$ values to explore different parts of the configuration space.

In step 1240, p is perturbed to permit mathematical minimization of p. The candidate set having the best score from the objective function is selected (step 1050, FIG. 10). The determined variations from step 1230 are applied to the selected candidate set to determine a new candidate set. The process is then repeated (starting with step 1020, FIG. 10). In various aspects, the determined variations are not recalculated during iteration (although they can be), since the determined variations are often consequences of the structure of the device.

To search for a smallest largest performance variation, constrained by the desired performance, a generalized pattern search (GPS) algorithm can be used. To minimize objective function (38), the MATLAB GPS routine called patternsearch can be used. In regards to FIG. 12, the GPS algorithm corresponds to the blocks of perturbation, objective, and minimization.

FIG. 13 is a flowchart showing an exemplary generalized pattern search (GPS) algorithm. As noted above, steps can be performed in any order unless limited, and identified components used for purposes of discussion are not limiting. Processing using the inputs shown in block 1310 begins with step 1340.

Block 1310 lists inputs to various aspects. The inputs include an initial set of parameters $p_0$, the SUGAR netlist, variations $\Delta p$, and the interval limits $[p_{min}, p_{max}]$ of the N parameters that are explored.

In step 1340, p is perturbed. Given the most recent $p_j$, the algorithm creates 2N additional sets of candidate parameters, $p_j^1 \ldots p_j^{2N}$. That is, for each of the N sweepable design parameters, the algorithm creates each new set of parameters by perturbing just one parameter element per set. It does this by adding dq(:,k) to the $k^{th}$ parameter, creating candidates $p_j^1 \ldots p_j^N$. Similarly, it subtracts dp(:,k) from each of the N parameters, one at a time, creating candidates $p_j^{N+1} \ldots p_j^{2N}$. Each of the 2N vectors are constrained by $p_{min} \leq p_j^k \leq p_{max}$. The sparse matrix dq is comprised of column vectors. Each column vector has only one non-zero element at row k. Each element is scaled according to the size and sweepable range of the corresponding $k^{th}$ parameter. A plot of the candidate parameters $p_j^1 \ldots p_j^{2N}$ forms a cluster of points about the most recent central point $p_j$. A measure of the size of this cluster is called the mesh.

In decision step 1362, the $p_j$ values are polled. Each of the new candidate parameters $p_j^k$ are polled by simulating them and ranking their fitness with respect to the objective function $$obj_j^k = |X(p_j^k + \Delta p_{upper}) - X(p_j^k + \Delta p_{lower})| - \|X_{desired}\| - \|X(p_j^k)\|. \quad (40)$$

The $p_j^k$ that yields $obj_j^k < obj_{j-1}$ is identified as a better set of parameters, and assigned to $p_j$. If the polling yields an objective that is not smaller than the previous set of parameters, step 1364 is next. If the polling yields an objective that is smaller in size than the previous set of parameters, step 1366 is next. If the polling yields an objective that satisfies a tolerance (e.g., $obj_j$ and $obj_{j-1}$ are within a certain amount of each other), step 1370 is next.

In step 1364, the mesh size is decreased. In an example, if the polling yields an objective that is not smaller than the previous set of parameters, then the previous set of parameters is reexamined using a smaller mesh size, by a factor of ½. This decrease in scaling is used to refine the search.

In step 1366, the mesh size is increased. In an example, if the polling yields an objective that is smaller in size than the previous set of parameters, then the size of the mesh is increased by a factor of 2. This increase in scaling is used to increase the search rate.

In step 1370, the determined $p_{j,opt}$ are output as the results of the search. These are the results provided in step 1270 (FIG. 12) or provided to steps 1060, 1070 (FIG. 10).

Figure 14:
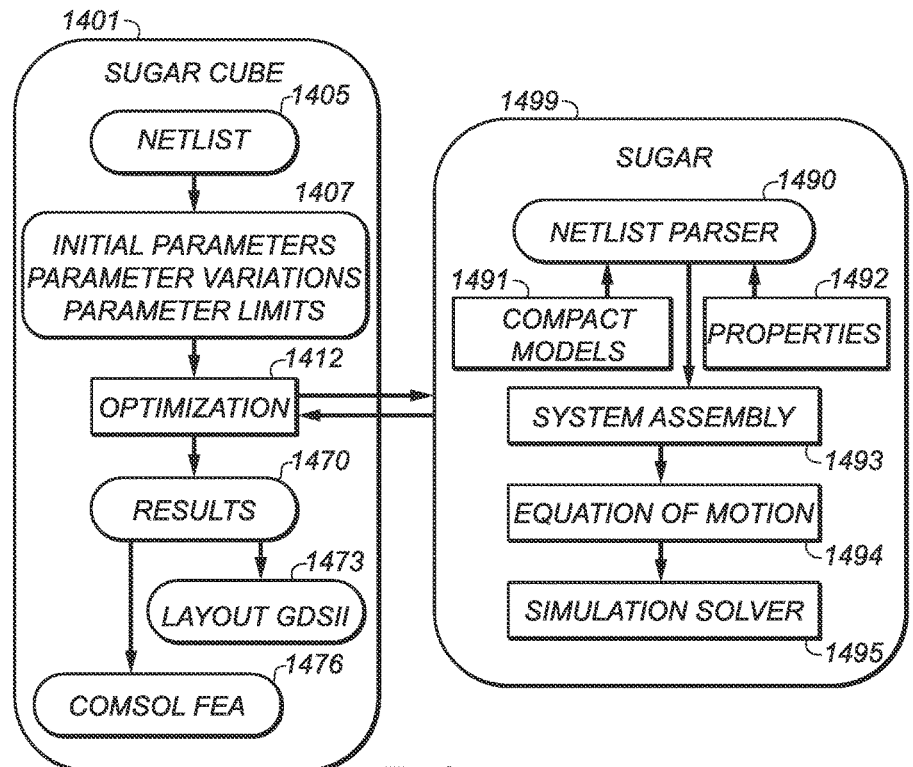
FIG. 14 is a block diagram showing integration of an exemplary parameter optimization feature within an exemplary simulation system.

FIG. 14 is a block diagram showing integration of an exemplary parameter optimization feature 1401 within an exemplary simulation system 1499.

Parameter optimization algorithm 1401 can be implemented in SUGARCUBE software. SUGARCUBE is a novice-friendly online CAD tool for exploring the design space of MEMS. Users can access SUGARCUBE online through a standard Internet web interface via a laptop, tablet, or smartphone. Computation is done remotely on clusters. The use of the parameter optimization within SUGARCUBE is outlined in FIG. 4, and works as outlined below in at least one exemplary aspect.

Block 1405 represents an input netlist. The user selects a parameterizable MEMS netlist from a library of ready-made netlists (see, e.g., FIG. 15), or uploads a new netlist into SUGARCUBE.

Block 1407 represents parameters, as discussed above. Once a netlist is loaded, its select parameters that may be modified are displayed. The parameters that are selected for modification are identified within the netlist. The netlist may be modified to change parameter selection and default values. The default values include common variation values and practical bounds due to typical fabrication limits. The default values help to reduce data-entry time for the user, or help suggest values that are not well-known to the user. Sliders enable quick modification of the parameters within the prescribed bounds. However, the default bounds may be overridden by the user for atypical processes.

Block 1412 represents optimization, as discussed above, specifically parameter optimization to minimize performance variation. The simulation part of this algorithm uses SUGAR or another simulation system 1499.

Simulation system 1499 can include netlist parsing step 1490 that uses information from compact models 1491 and properties 1492. After parsing, a system assembly step 1493 is performed. An equation of motion is determined for the MEMS device (step 1494), and the equation is solved to provide a simulation result (step 1495). The simulation result is then provided back to block 1412.

Block 1470 represents optimization results. After a mathematically-optimal set of parameters are obtained, the deflected MEMS is displayed, numerical results may be given, or data may be plotted in 2D or 3D.

Block 1473 represents the production of layout data, e.g., GDSII data. A layout, e.g., in standard GDSII format, can be generated from the results (block 1470). The parameters that are swept for plots can be used to create layout arrays. The size of the array is determined by the number of divisions prescribed in the parameter sweep. A one parameter sweep generates a 1D layout array; a two parameter sweep generates a 2D layout array. This permits readily testing various configurations of a MEMS device.

Block 1476 represents finite-element analysis (FEA), e.g., in a program such as COMSOL MULTIPHYSICS. SUGAR uses compact models, in which the details of the model are lumped into a small number of nodes. Finer spatial detail can be obtained by analyzing distributed elements, such as via FEA. Such refined analysis can be done in SUGARCUBE, which can convert the resultant netlist into a COMSOL script, and execute COMSOL commands to carry out the FEA.

Figure 15:
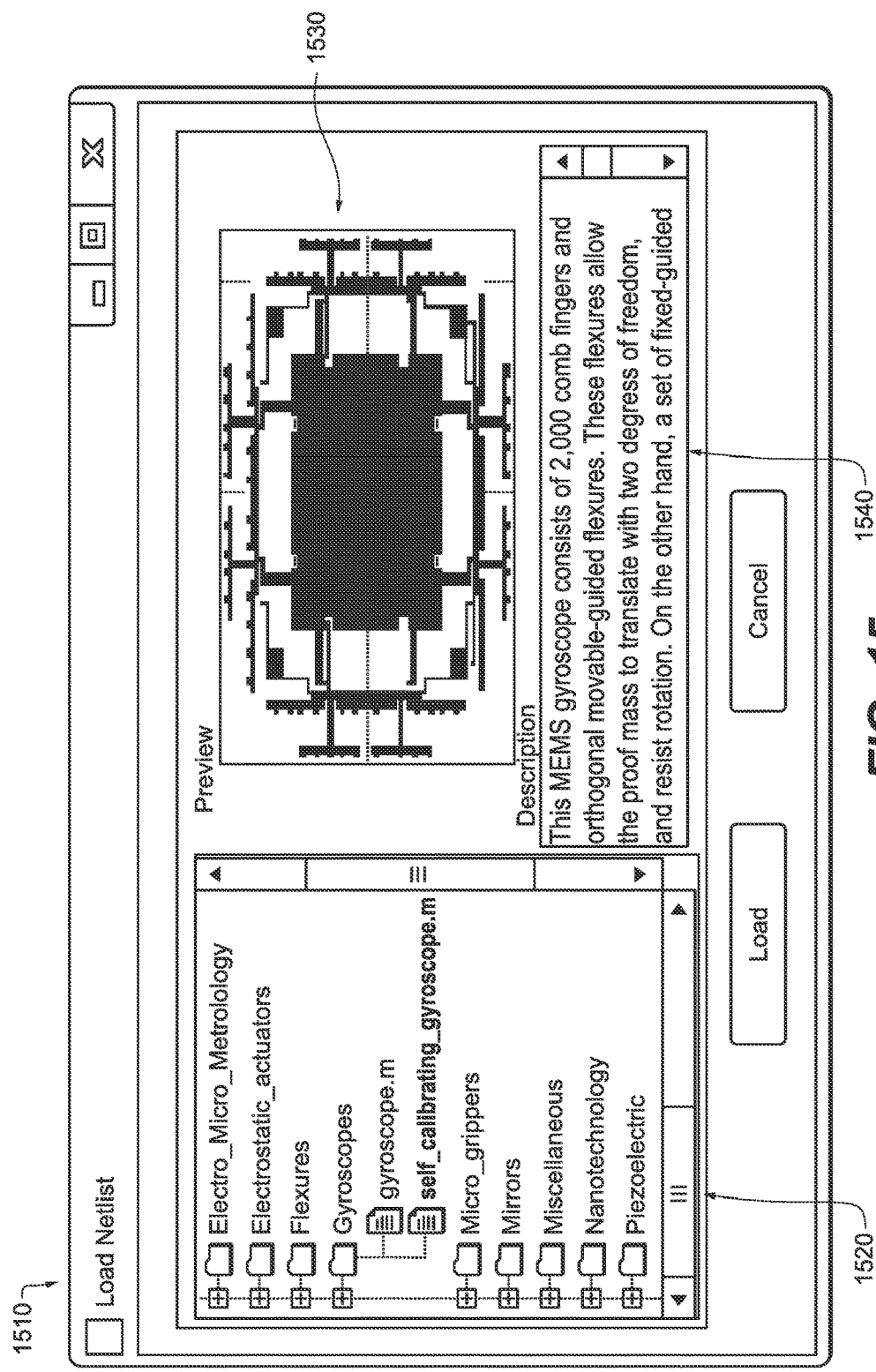
FIG. 15 is a graphical representation of an exemplary computer display depicting a representative MEMS device.

FIG. 15 is a graphical representation of an exemplary computer display depicting a representative MEMS device. In various aspects, ready-made parameterizable MEMS models (e.g., netlists) can be provided for use, e.g., in the SUGARCUBE library. New MEMS devices can be imported using SUGAR.

FIG. 15 depicts a display window 1510 include library display 1520 listing available MEMS devices. Preview 1530 shows a representation of the mechanical structure of the selected device, in this example "self_calibrating_gyroscope.m". Description 1540 shows descriptive text regarding the selected device.

Figure 16:
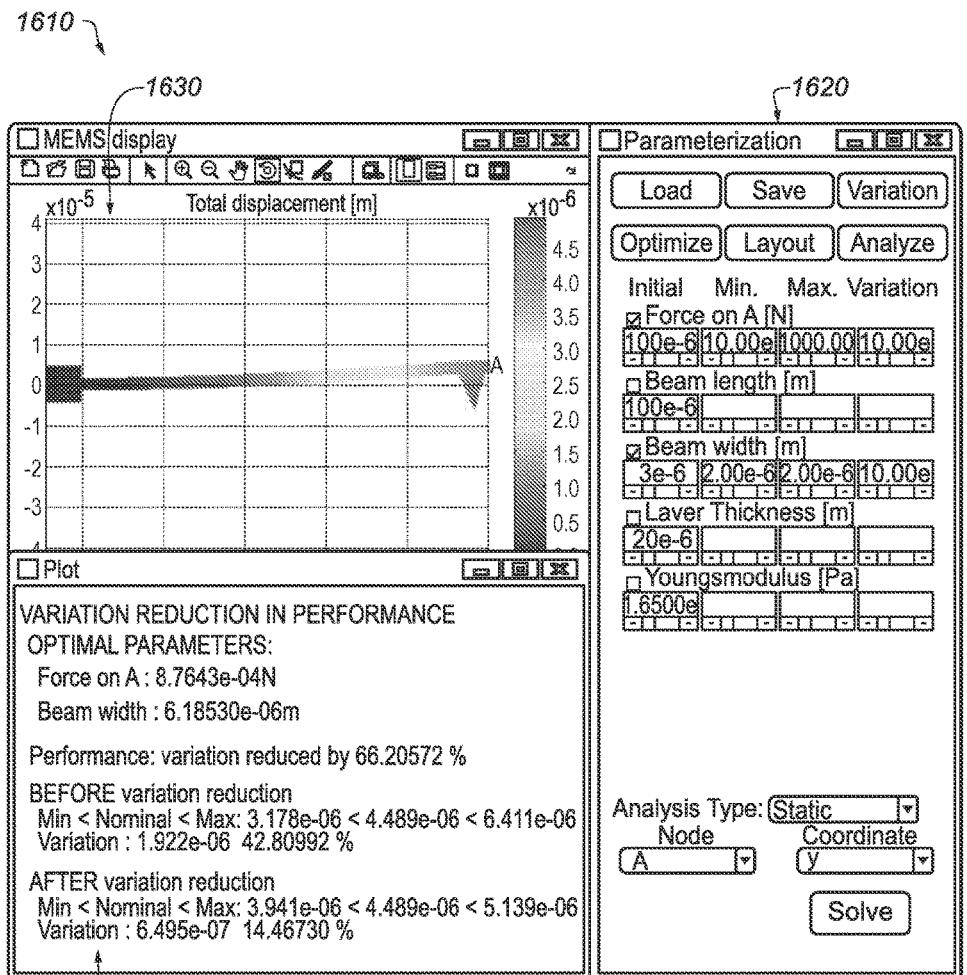
FIGS. 16 and 17 are graphical representations of exemplary computer displays depicting representative MEMS devices and parameters thereof.

FIG. 16 is a graphical representation of an exemplary computer display depicting a representative MEMS device and parameters thereof. FIG. 16 shows an example of an interface for parameter optimization for deflection of an atomic-force microscope (AFM) cantilever.

Cantilevers used in atomic force microscopes come in various geometric forms. The material and geometric properties of those cantilevers have uncertainties that often limit the calibration of stiffness to about 10-30%. This uncertainty affects readings of displacement or force from the AFM. Reducing the variation in performance advantageously improves the accuracy and precision of the AFM.

Static displacement and Eigen-frequencies are important modes of operation for the AFM. The example of FIG. 16 is a simple geometric form of an AFM cantilever used to illustrate parameter optimization methods described herein (e.g., FIG. 10).

In this example, applied force F and cantilever width w are selected as two parameters to optimize. Initial parameters provide the desired displacement. SUGARCUBE determines which width and applied force that yields a smallest variation in displacement.

The variation (or uncertainty) for force F is $\Delta F$, and the variation for width w is $\Delta w$. That is, $F \in [F-\Delta F, F+\Delta F]$ and $w \in [w-\Delta w, w+\Delta w]$. SUGARCUBE analysis and other embodiments herein are able to account for the moment arm generated by the probe tip, the offset of the probe from the edge of the cantilever, the mass of the probe during eigenfrequency analysis, probe tip forces at various angles, torsional effect, deflection angles, etc.

In this example, SUGARCUBE is used to determine which geometry of cantilever is preferred over a particular range of applied forces to reduce the uncertainty in deflection. A generic parameterized AFM cantilever netlist can be used, e.g., selected from library display 1520 (FIG. 15). Display 1610 includes parameter window 1620, in which the user can enter initial parameters corresponding to a desired performance, interval bounds of each parameter that will be explored, and a type of analysis (here, "static"). Parameter window 1620 also permits selecting the node and coordinate for which performance will be measured. FIG. 6 shows the results of parameter optimization analysis performed on an AFM cantilever.

Plot 1630 shows the simulated static deflection of the cantilever under conditions corresponding to the determined mathematically-optimized parameters. In a simulated example, the initial design parameters yield a static deflection of 4.5 um±1.9 um, or ±42%. However, SUGARCUBE's optimized design parameters yield a static deflection of 4.5±0.65 um, or ±14%. Stated another way, without changing the uncertainties in the parameters, SUGARCUBE found a better cantilever design that reduces uncertainty by 66% while achieving exactly the same desired performance. Readout 1640 shows the parameters and before and after variation results.

Figure 17:
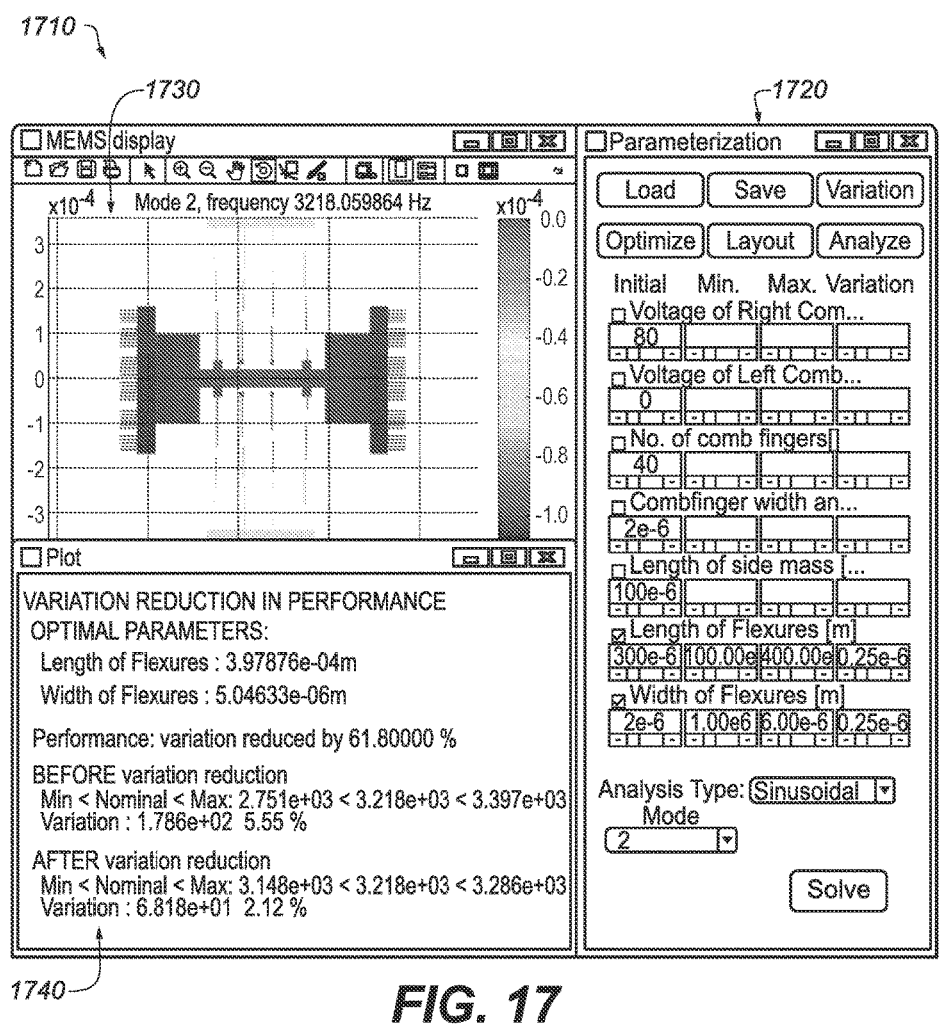

FIG. 17 is a graphical representation of an exemplary computer display depicting a representative MEMS device and parameters thereof. FIG. 17 shows an example of an interface for parameter optimization for a folded flexure comb drive resonator. Sinusoidal analysis of vibration mode 2 is explored. Flexure length and flexure width are optimized to obtain a desired resonant frequency with reduced variation in performance. Display 1710 includes parameter window 1720, plot 1730, and readout 1740.

Folded flexure comb resonators are a frequently-studied MEMS structure. A useful feature of such resonators is their resistance to rotate or translate in any other planar direction than along the comb drive direction (e.g., the X axis in FIG. 1). Although many aspects of this type of structure has been well-characterized, optimization of its parameters that might yield a reduced variation in resonance frequency has yet to be explored. SUGARCUBE analysis is able to accommodate the variations in geometric and material property that affect mass, stiffness, and damping, including damping due to the number of comb fingers or gap size between fingers. The dependencies of mass m, damping d, and stiffness k on displacement amplitude resonance frequency can be expressed as:

$$\omega_r = \sqrt{k/m - d^2/2m^2}. \quad (41)$$

In this example, it is desired to optimize the length and width of a folded flexure resonator with the following constraints. The length of the flexures can be no longer than 400 um, the widths can be no smaller than 2 um, and the desired resonance frequency must be 3.218 kHz, which is the resonance frequency that was predicted using a layout geometry length of 300 um and a width of 2 um. It is known that the uncertainty in geometry of a particular process is 0.25 um. Data from fabrication runs can also be used. In this example, measurements of frequency from several fabrication runs of this particular design range from 2.7 to 3.4 kHz, due to the 0.25 um variation in geometry. These or other parameters can be entered in parameter window 1720. As shown, the analysis type is "sinusoidal" instead of static. Methods described herein (e.g., FIGS. 10, 12, 13) can be used to create structures that, when fabricated, will have a significantly reduced variation in frequency about the desired frequency.

The SUGARCUBE results for parameter optimization are shown in plot 1730 and readout 1740. Analysis for the initial layout parameters yields a nominal resonance frequency of 3.218 kHz±0.178 kHz or ±5.6%. The mathematically-optimized design parameters yield the same nominal frequency of 3.218 kHz but with a significantly reduced variation of ±0.068 kHz or ±2.1%. That is a 61.8% improvement in reduced variation in performance.

A parameter optimization algorithm according to various aspects can reduce the predicted variation in performance of MEMS subject to process variations. The algorithm does this by searching the design space for a set of parameters that is least sensitive to a given set of parameter variations. The optimization search is constrained by the desired performance, which is determined from an initial set of parameters. In an example, the optimal static deflection of an AFM cantilever netlist has its performance variation reduced by 66%, and the optimal resonance frequency of a folded flexure resonator has had its performance variation reduced by 62%. Algorithms according to various aspects can be available online, e.g., within SUGARCUBE.

In various aspects, the method of FIG. 10 is used to develop an improved design for the device in FIG. 1. This permits tuning as described with reference to FIG. 10 beginning from a state of reduced variation, increasing the tuning latitude. Tuning as discussed with reference to FIG. 1 can be limited by saturation or instability of the output amplifiers or by dielectric breakdown of the components (e.g., at about 200 V). Improving the design as discussed with reference to FIG. 10 reduces the overhead required on actuators 132, 162 to account for variation. Moreover, using FIG. 10 to tune devices of FIG. 1 permits reducing the output amplitude of signals sent to actuators 132, 162 and other drives of driven mass 111. This reduces the energy required to cycle a vibratory mass, making more energy available for performance tuning.

In view of the foregoing, various aspects provide improved evaluation of parameter sets to reduce variation of MEMS devices during operation. A technical effect of various aspects is to modify the MEMS design so that tangible MEMS devices produced according to the modified design will have more precise performance than unmodified-design devices for the same range of variations in manufacturing and use. A technical effect of various aspects is to present a visual representation of the modified design or parameters thereof on a display screen (e.g., as shown in FIGS. 16 and 17).

FIG. 18 is a high-level diagram showing the components of an exemplary data-processing system for analyzing data and performing other analyses described herein, and related components. The system includes a processor 1886, a peripheral system 1820, a user interface system 1830, and a data storage system 1840. The peripheral system 1820, the user interface system 1830 and the data storage system 1840 are communicatively connected to the processor 1886. Processor 1886 can be communicatively connected to network 1850 (shown in phantom), e.g., the Internet or an X.185 network, as discussed below. Devices 150, 180, 186, 187 (FIG. 1) and hardware implementations of blocks 1401, 1499 (FIG. 14) can each include one or more of systems 1886, 1820, 1830, 1840, and can each connect to one or more network(s) 1850. Processor 1886, and other processing devices described herein, can each include one or more microprocessors, microcontrollers, field-programmable gate arrays (FPGAs), application-specific integrated circuits (ASICs), programmable logic devices (PLDs), programmable logic arrays (PLAs), programmable array logic devices (PALs), or digital signal processors (DSPs).

Processor 1886 can implement processes of various aspects described herein. Processor 1886 can be embodied in a desktop computer, laptop computer, industrial computer, mainframe computer, personal digital assistant, digital camera, cellular phone, smartphone, or any other device for processing data, managing data, or handling data, whether implemented with electrical, magnetic, optical, biological components, or otherwise. Processor 1886 can include Harvard-architecture components, modified-Harvard-architecture components, or Von-Neumann-architecture components.

The phrase "communicatively connected" includes any type of connection, wired or wireless, for communicating data between devices or processors. These devices or processors can be located in physical proximity or not. For example, subsystems such as peripheral system 1820, user interface system 1830, and data storage system 1840 are shown separately from the processor 1886 but can be stored completely or partially within the processor 1886.

The peripheral system 1820 can include one or more devices configured to provide digital content records to the processor 1886. For example, the peripheral system 1820 can include digital still cameras, digital video cameras, cellular phones, or other data processors. The processor 1886, upon receipt of digital content records from a device in the peripheral system 1820, can store such digital content records in the data storage system 1840.

The user interface system 1830 can include a mouse, a keyboard, another computer (connected, e.g., via a network or a null-modem cable), or any device or combination of devices from which data is input to the processor 1886. The user interface system 1830 also can include a display device, a processor-accessible memory, or any device or combination of devices to which data is output by the processor 1886. The user interface system 1830 and the data storage system 1840 can share a processor-accessible memory.

In various aspects, processor 1886 includes or is connected to communication interface 1815 that is coupled via network link 1816 (shown in phantom) to network 1850. For example, communication interface 1815 can include an integrated services digital network (ISDN) terminal adapter or a modem to communicate data via a telephone line; a network interface to communicate data via a local-area network (LAN), e.g., an Ethernet LAN, or wide-area network (WAN); or a radio to communicate data via a wireless link, e.g., WiFi or GSM. Communication interface 1815 sends and receives electrical, electromagnetic or optical signals that carry digital or analog data streams representing various types of information across network link 1816 to network 1850. Network link 1816 can be connected to network 1850 via a switch, gateway, hub, router, or other networking device.

Processor 1886 can send messages and receive data, including program code, through network 1850, network link 1816 and communication interface 1815. For example, a server can store requested code for an application program (e.g., a JAVA applet) on a tangible non-volatile computer-readable storage medium to which it is connected. The server can retrieve the code from the medium and transmit it through network 1850 to communication interface 1815. The received code can be executed by processor 1886 as it is received, or stored in data storage system 1840 for later execution.

Data storage system 1840 can include or be communicatively connected with one or more processor-accessible memories configured to store information. The memories can be, e.g., within a chassis or as parts of a distributed system. The phrase "processor-accessible memory" is intended to include any data storage device to or from which processor 1886 can transfer data (using appropriate components of peripheral system 1820), whether volatile or non-volatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs). One of the processor-accessible memories in the data storage system 1840 can be a tangible non-transitory computer-readable storage medium, i.e., a non-transitory device or article of manufacture that participates in storing instructions that can be provided to processor 1886 for execution.

In an example, data storage system 1840 includes code memory 1841, e.g., a RAM, and disk 1843, e.g., a tangible computer-readable rotational storage device such as a hard drive. Computer program instructions are read into code memory 1841 from disk 1843. Processor 1886 then executes one or more sequences of the computer program instructions loaded into code memory 1841, as a result performing process steps described herein. In this way, processor 1886 carries out a computer implemented process. For example, steps of methods described herein, blocks of the flowchart illustrations or block diagrams herein, and combinations of those, can be implemented by computer program instructions. Code memory 1841 can also store data, or can store only code.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

Furthermore, various aspects herein may be embodied as computer program products including computer readable program code stored on a tangible non-transitory computer readable medium. Such a medium can be manufactured as is conventional for such articles, e.g., by pressing a CD-ROM. The program code includes computer program instructions that can be loaded into processor 1886 (and possibly also other processors), to cause functions, acts, or operational steps of various aspects herein to be performed by the processor 1886 (or other processor). Computer program code for carrying out operations for various aspects described herein may be written in any combination of one or more programming language(s), and can be loaded from disk 1843 into code memory 1841 for execution. The program code may execute, e.g., entirely on processor 1886, partly on processor 1886 and partly on a remote computer connected to network 1850, or entirely on the remote computer.

The invention is inclusive of combinations of the aspects described herein. References to "a particular aspect" (or "embodiment" or "version") and the like refer to features that are present in at least one aspect of the invention. Separate references to "an aspect" or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. A microelectromechanical-systems (MEMS) device, comprising:
    a) a mechanical subsystem including a driven mass, the subsystem having a natural stiffness or a natural damping, wherein the driven mass is at least partly movable or at least partly deformable;
    b) an actuator responsive to a time-varying control signal to apply force to the driven mass;
    c) a sensing capacitor including a first plate attached to and movable with the driven mass and a second plate substantially fixed in position, wherein a capacitance of the sensing capacitor varies as the driven mass moves;
    d) a measurement circuit responsive to the capacitance of the sensing capacitor to provide first and second signals corresponding respectively to a displacement and to a velocity of the driven mass; and
    e) a control circuit configured to provide the time-varying control signal to the actuator in response to the first signal or the second signal and in response to a selected parameter, so that a characteristic stiffness or a characteristic damping of the mechanical subsystem is different from the natural stiffness or the natural damping, respectively, while the time-varying control signal is applied to the actuator, wherein the measurement circuit is further configured to provide a third signal corresponding to an acceleration of the mass, the mechanical subsystem has a natural mass, and the control circuit is further configured to provide the time-varying control signal to the actuator in response to the third signal, so that a characteristic mass of the mechanical subsystem is different from the natural mass while the time-varying control signal is applied to the actuator.

2. The device according to claim 1, wherein the actuator is configured to apply the force to the driven mass in a direction along a displacement axis, the device further including:
    a second actuator responsive to a second time-varying control signal to apply force to the driven mass in a second, different direction along the displacement axis;
    a second sensing capacitor including a first plate attached to and movable with the driven mass and a second plate substantially fixed in position, wherein a second capacitance of the second sensing capacitor varies as the driven mass moves or deforms;
    a second measurement circuit responsive to the second capacitance to provide fourth and fifth signals corresponding respectively to the displacement and to the velocity of the driven mass; and
    a second control circuit configured to provide the second time-varying control signal to the second actuator in response to the fourth signal or the fifth signal and in response to a second selected parameter, so that a characteristic stiffness or a characteristic damping of the mechanical subsystem is different from the natural stiffness or the natural damping, respectively, while the time-varying control signal is applied to the second actuator.

3. The device according to claim 2, wherein the second measurement circuit is further configured to provide a sixth signal corresponding to the acceleration of the driven mass, the mechanical subsystem has a natural mass, and the second control circuit is further configured to provide the second time-varying control signal to the second actuator in response to the sixth signal, so that a characteristic mass of the mechanical subsystem is different from the natural mass while the second time-varying control signal is applied to the second actuator.

4. The system according to claim 1, wherein the actuator is configured to apply the force to the driven mass along a displacement axis and the driven mass includes an applicator forming an end of the driven mass along the displacement axis.

5. The device according to claim 1, wherein the actuator is configured to apply the force to the driven mass along a displacement axis and the mechanical subsystem includes a plurality of flexures supporting the driven mass and adapted to permit the driven mass to translate along the displacement axis.

6. The device according to claim 1, wherein the actuator includes a comb drive and a voltage source.

7. The device according to claim 1, wherein the measurement circuit includes a differentiator configured to receive a signal corresponding to the capacitance of the sensing capacitor and provide the second signal corresponding to the velocity.

* * * * *